(12) United States Patent
Liu et al.

(10) Patent No.: US 11,790,147 B1
(45) Date of Patent: Oct. 17, 2023

(54) SYSTEM AND METHOD FOR ROUTING IN AN ELECTRONIC DESIGN

(71) Applicant: Cadence Design Systems, Inc., San Jose, CA (US)

(72) Inventors: Hongzhou Liu, Sewickley, PA (US); Rahaprian Premavathi Mudiarasan, Pittsburgh, PA (US); Sandipan Ghosh, San Jose, CA (US); Hui Xu, Wexford, PA (US); Chris (Shyh-Chang) Lin, Hsinchu (TW); Joshua Baudhuin, Portland, OR (US); Ron Pyke, Bellevue, WA (US); Juno Lin, Saratoga, CA (US); Allen You, Taipei (TW); Yu Liu, Shanghai (CN); Jiulong Zhang, New York, NY (US); Thomas Richards, Pittsburgh, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 41 days.

(21) Appl. No.: 17/532,087

(22) Filed: Nov. 22, 2021

(51) Int. Cl.
*G06F 30/3953* (2020.01)
*G06F 30/31* (2020.01)
*G06F 30/398* (2020.01)
*G06F 30/3947* (2020.01)
*G06F 30/394* (2020.01)

(52) U.S. Cl.
CPC ......... *G06F 30/3953* (2020.01); *G06F 30/31* (2020.01); *G06F 30/394* (2020.01); *G06F 30/398* (2020.01); *G06F 30/3947* (2020.01)

(58) Field of Classification Search
CPC .................................................. G06F 30/3953
USPC ....................................................... 716/126
See application file for complete search history.

(56) References Cited

U.S. PATENT DOCUMENTS

2021/0049315 A1* 2/2021 Liao .................... H01L 24/19

* cited by examiner

*Primary Examiner* — Eric D Lee
(74) *Attorney, Agent, or Firm* — Mark H. Whittenberger; Holland & Knight LLP

(57) ABSTRACT

Embodiments include herein are directed towards a method for electronic circuit design. Embodiments may include receiving, using a processor, an electronic design library including a plurality of design rules. Embodiments may include generating a routing graph, based upon, at least in part, the plurality of design rules, wherein the routing graph is a virtual representation of all of the available routing space for all routing layers associated with an electronic design. Embodiments may further include dynamically updating the routing graph at a graphical user interface, based upon, at least in part, a creation of a routing segment or a via at the graphical user interface.

18 Claims, 28 Drawing Sheets receiving, using a processor, an electronic design library including a plurality of design rules

202 generating a routing graph, based upon, at least in part, the plurality of design rules, wherein the routing graph is a virtual representation of all of the available routing space for all routing layers associated with an electronic design

204 dynamically updating the routing graph at a graphical user interface, based upon, at least in part, a creation of a routing segment or a via at the graphical user interface

206

1800

SYSTEM AND METHOD FOR ROUTING IN AN ELECTRONIC DESIGN

FIELD OF THE INVENTION

The present disclosure relates to a method of electronic circuit design, and more particularly, to a method of routing in electronic designs.

BACKGROUND

Electronic design applications exist that support custom analog, digital, and mixed-signal designs at the device, cell, block, and chip levels. Full custom digital designs may contain many variants of one or more logical cells (e.g., NAND2, NAND3, NOR3, etc.). All of these variants have different device gate lengths and widths associated therewith. In existing systems the user has to manually place and route all of the devices within all those cells and the routing between each device must respect some topology. Even assuming an acceptable placement, the routing is tedious, time consuming and error prone. Fully automatic routing is unacceptable as it is very challenging to develop a fully automatic router given the complexity of design rule checking.

SUMMARY

In one or more embodiments of the present disclosure, a computer-implemented method for electronic circuit design is provided. The method may include receiving, using a processor, an electronic design library including a plurality of design rules. The method may include generating a routing graph, based upon, at least in part, the plurality of design rules, wherein the routing graph is a virtual representation of all of the available routing space for all routing layers associated with an electronic design. The method may further include dynamically updating the routing graph at a graphical user interface, based upon, at least in part, a creation of a routing segment or a via at the graphical user interface.

One or more of the following features may be included. In some embodiments, the routing graph may include one or more edges and one or more vertices. The routing graph may be based upon, at least in part, one or more width spacing pattern ("WSP") tracks for each routing layer. The method may include identifying at least one pre-routed shape or route segment on the one or more WSP tracks. The method may also include generating a spacing influence region around the at least one pre-routed shape or route segment. The method may further include analyzing the remaining unoccupied space on the one or more WSP tracks. The method may also include identifying at least one intersection between a first WSP track on a first layer and a second WSP track on a second layer. Generating a spacing influence region may be based upon, at least in part, a segment service analysis. Generating a spacing influence region may be based upon, at least in part, a via service analysis. The via service may provide a router with an optimal via to satisfy a design rule check analysis.

In one or more embodiments of the present disclosure a computer-readable storage medium having stored thereon instructions, which when executed by a processor result in one or more operations is provided. Operations may include receiving, using a processor, an electronic design library including a plurality of design rules. Operations may include generating a routing graph, based upon, at least in part, the plurality of design rules, wherein the routing graph is a virtual representation of all of the available routing space for all routing layers associated with an electronic design. Operations may further include dynamically updating the routing graph at a graphical user interface, based upon, at least in part, a creation of a routing segment or a via at the graphical user interface.

One or more of the following features may be included. In some embodiments, the routing graph may include one or more edges and one or more vertices. The routing graph may be based upon, at least in part, one or more width spacing pattern ("WSP") tracks for each routing layer. Operations may include identifying at least one pre-routed shape or route segment on the one or more WSP tracks. Operations may also include generating a spacing influence region around the at least one pre-routed shape or route segment. Operations may further include analyzing the remaining unoccupied space on the one or more WSP tracks. The method may also include identifying at least one intersection between a first WSP track on a first layer and a second WSP track on a second layer. Generating a spacing influence region may be based upon, at least in part, a segment service analysis. Generating a spacing influence region may be based upon, at least in part, a via service analysis. The via service may provide a router with an optimal via to satisfy a design rule check analysis.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

DETAILED DESCRIPTION

Figure 1:
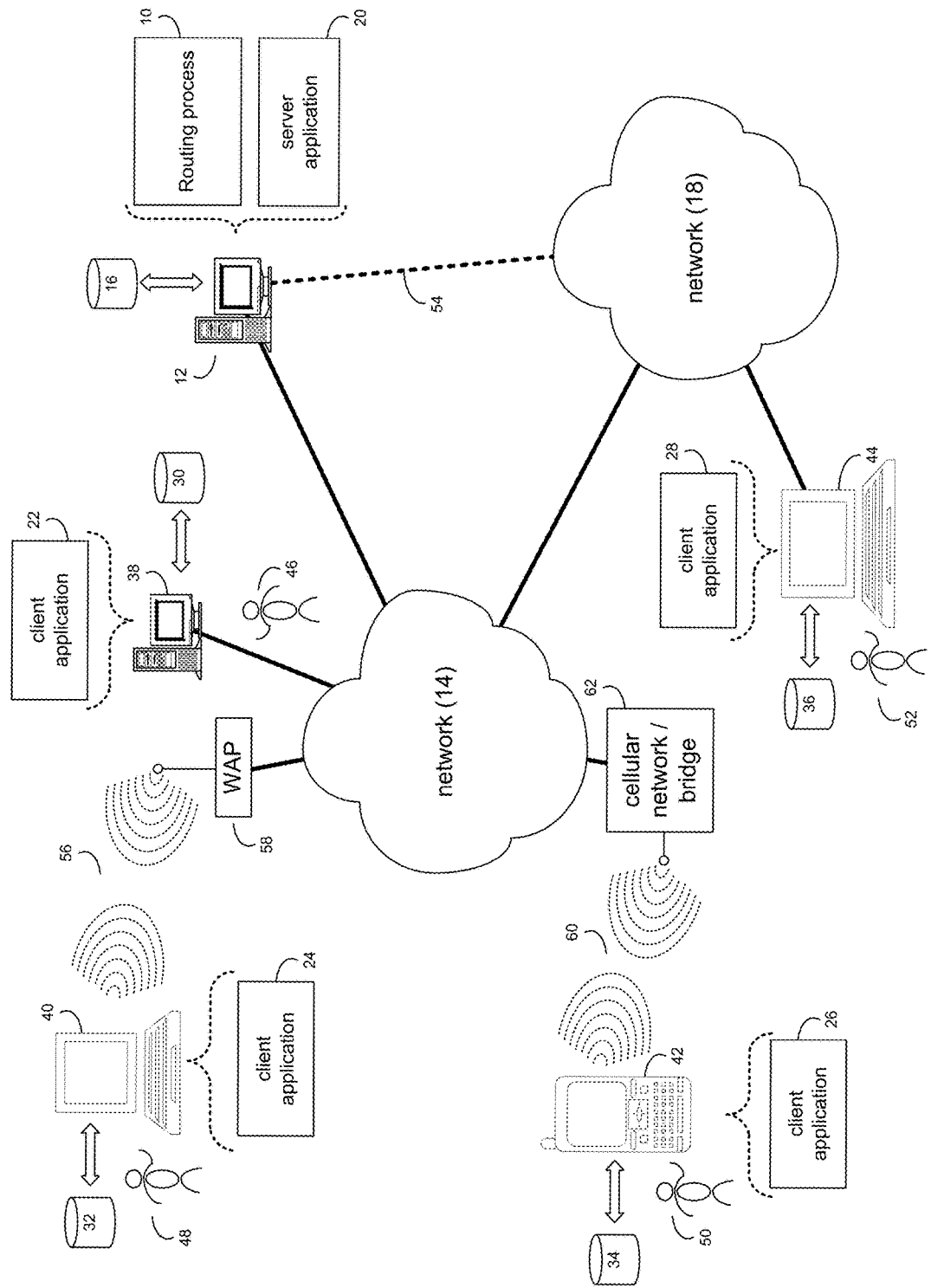
FIG. 1 diagrammatically depicts a routing process coupled to a distributed computing network.

Embodiments of the present disclosure are directed towards a routing process that may be used in the field of electronic design. Accordingly, the routing process described herein may be configured to automatically route a design while taking into account different design rule checking rules from various foundries. Embodiments included herein may utilize a grid-based process that is based upon the concept of a routing graph, which is discussed in further detail hereinbelow.

Reference will now be made in detail to the embodiments of the present disclosure, examples of which are illustrated in the accompanying drawings. The present disclosure may, however, be embodied in many different forms and should not be construed as being limited to the embodiments set forth herein; rather, these embodiments are provided so that this disclosure will be thorough and complete, and will fully convey the concept of the present disclosure to those skilled in the art. In the drawings, the thicknesses of layers and regions may be exaggerated for clarity. Like reference numerals in the drawings may denote like elements.

Referring to FIG. 1, there is shown a routing process 10 that may reside on and may be executed by server computer 12, which may be connected to network 14 (e.g., the internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft Windows XP Server™; Novell Netware™; or Redhat Linux™, for example. Additionally and/or alternatively, routing process 10 may reside on a client electronic device, such as a personal computer, notebook computer, personal digital assistant, or the like.

The instruction sets and subroutines of routing process 10, which may be stored on storage device 16 coupled to server computer 12, may be executed by one or more processors (not shown) and one or more memory architectures (not shown) incorporated into server computer 12. Storage device 16 may include but is not limited to: a hard disk drive; a tape drive; an optical drive; a RAID array; a random access memory (RAM); and a read-only memory (ROM).

Server computer 12 may execute a web server application, examples of which may include but are not limited to: Microsoft IIS™, Novell Webserver™, or Apache Webserver™, that allows for HTTP (i.e., HyperText Transfer Protocol) access to server computer 12 via network 14. Network 14 may be connected to one or more secondary networks (e.g., network 18), examples of which may include but are not limited to: a local area network; a wide area network; or an intranet, for example.

Server computer 12 may execute one or more server applications (e.g., server application 20), examples of which may include but are not limited to, e.g., Lotus Domino™ Server and Microsoft Exchange™ Server. Server application 20 may interact with one or more client applications (e.g., client applications 22, 24, 26, 28) in order to execute routing process 10. Examples of client applications 22, 24, 26, 28 may include, but are not limited to, design verification tools such as those available from the assignee of the present disclosure. These applications may also be executed by server computer 12. In some embodiments, routing process 10 may be a stand-alone application that interfaces with server application 20 or may be an applet/application that is executed within server application 20.

The instruction sets and subroutines of server application 20, which may be stored on storage device 16 coupled to server computer 12, may be executed by one or more processors (not shown) and one or more memory architectures (not shown) incorporated into server computer 12.

As mentioned above, in addition/as an alternative to being a server-based application residing on server computer 12, the routing process may be a client-side application (not shown) residing on one or more client electronic devices 38, 40, 42, 44 (e.g., stored on storage devices 30, 32, 34, 36, respectively). As such, the routing process may be a stand-alone application that interfaces with a client application (e.g., client applications 22, 24, 26, 28), or may be an applet/application that is executed within a client application. As such, the routing process may be a client-side process, a server-side process, or a hybrid client-side/server-side process, which may be executed, in whole or in part, by server computer 12, or one or more of client electronic devices 38, 40, 42, 44.

The instruction sets and subroutines of client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory architectures (not shown) incorporated into client electronic devices 38, 40, 42, 44 (respectively). Storage devices 30, 32, 34, 36 may include but are not limited to: hard disk drives; tape drives; optical drives; RAID arrays; random access memories (RAM); read-only memories (ROM), compact flash (CF) storage devices, secure digital (SD) storage devices, and memory stick storage devices. Examples of client electronic devices 38, 40, 42, 44 may include, but are not limited to, personal computer 38, laptop computer 40, personal digital assistant 42, notebook computer 44, a data-enabled, cellular telephone (not shown), and a dedicated network device (not shown), for example. Using client applications 22, 24, 26, 28, users 46, 48, 50, 52 may utilize formal analysis, testbench simulation, and/or hybrid technology features verify a particular integrated circuit design.

Users 46, 48, 50, 52 may access server application 20 directly through the device on which the client application (e.g., client applications 22, 24, 26, 28) is executed, namely client electronic devices 38, 40, 42, 44, for example. Users 46, 48, 50, 52 may access server application 20 directly through network 14 or through secondary network 18. Further, server computer 12 (e.g., the computer that executes server application 20) may be connected to network 14 through secondary network 18, as illustrated with phantom link line 54.

In some embodiments, routing process 10 may be a cloud-based process as any or all of the operations described herein may occur, in whole, or in part, in the cloud or as part of a cloud-based system. The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 56 established between laptop computer 40 and wireless access point (i.e., WAP) 58, which is shown directly coupled to network 14. WAP 58 may be, for example, an IEEE 802.11a, 802.11b, 802.11g, Wi-Fi, and/or Bluetooth device that is capable of establishing wireless communication channel 56 between laptop computer 40 and WAP 58. Personal digital assistant 42 is shown wirelessly coupled to network 14 via wireless communication channel 60 established between personal digital assistant 42 and cellular network/bridge 62, which is shown directly coupled to network 14.

As is known in the art, all of the IEEE 802.11x specifications may use Ethernet protocol and carrier sense multiple access with collision avoidance (CSMA/CA) for path sharing. The various 802.11x specifications may use phase-shift keying (PSK) modulation or complementary code keying (CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows™, Microsoft Windows CE™, Redhat Linux™, Apple iOS, ANDROID, or a custom operating system.

Figure 2:
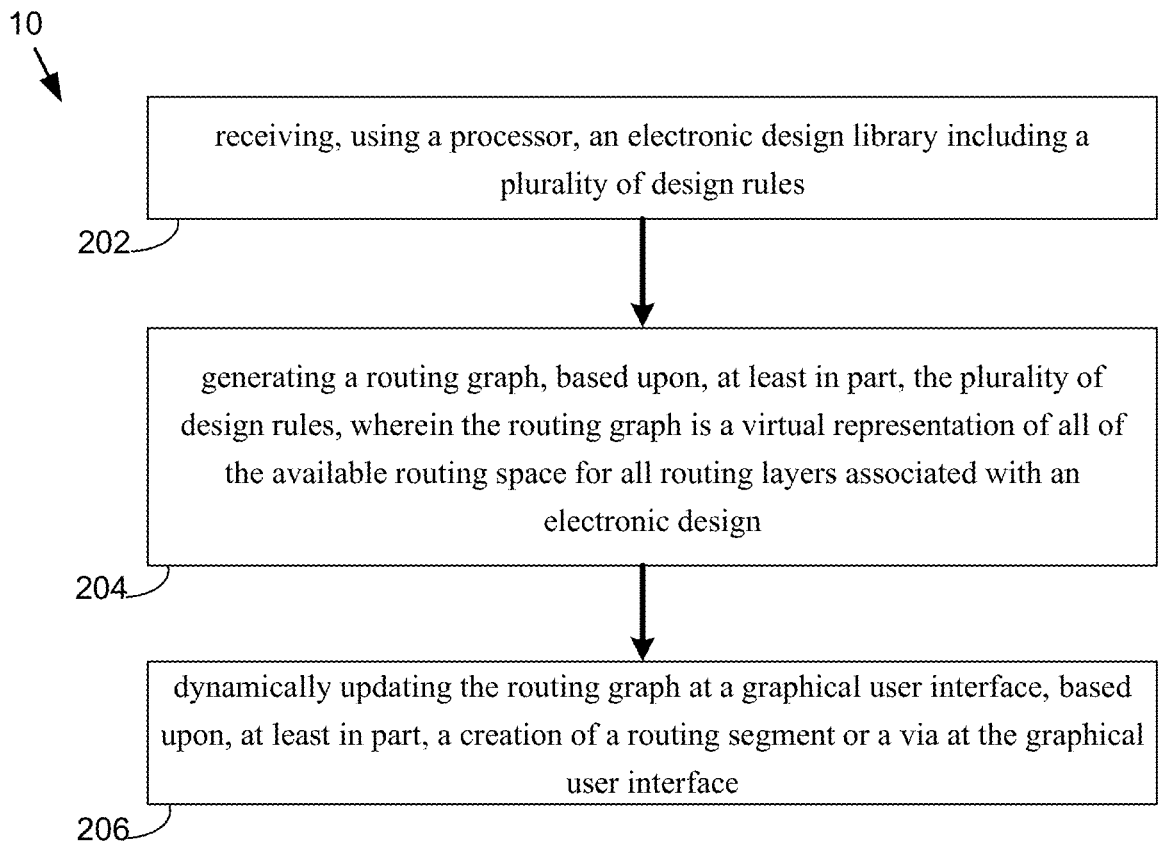
FIG. 2 is an exemplary flowchart of a routing process according to an embodiment of the present disclosure.

Referring now to FIG. 2, a flowchart depicting an embodiment consistent with routing process 10 is provided. Embodiments may include receiving (202), using a processor, an electronic design library including a plurality of design rules. The method may include generating (204) a routing graph, based upon, at least in part, the plurality of design rules, wherein the routing graph is a virtual representation of all of the available routing space for all routing layers associated with an electronic design. The method may further include dynamically updating (206) the routing graph at a graphical user interface, based upon, at least in part, a creation of a routing segment or a via at the graphical user interface. Numerous other operations are also within the scope of the present disclosure.

Embodiments of routing process 10 employ a novel routing grids system, which may be decoupled from core routing algorithms. Accordingly, routing process 10 may encode different-net DRC rules in the grids and/or may aggregate similar DRC rules together. Routing process 10 may also be configured to run a quick checker for a same-net DRC rule and scales well with different process design kits ("PDK") and design. As used herein, the phrase "PDK" may refer to a set of files used within the semiconductor industry to model transistors for a certain technology for a certain foundry, different types of libraries may be used with a given design software tool.

Figure 3:
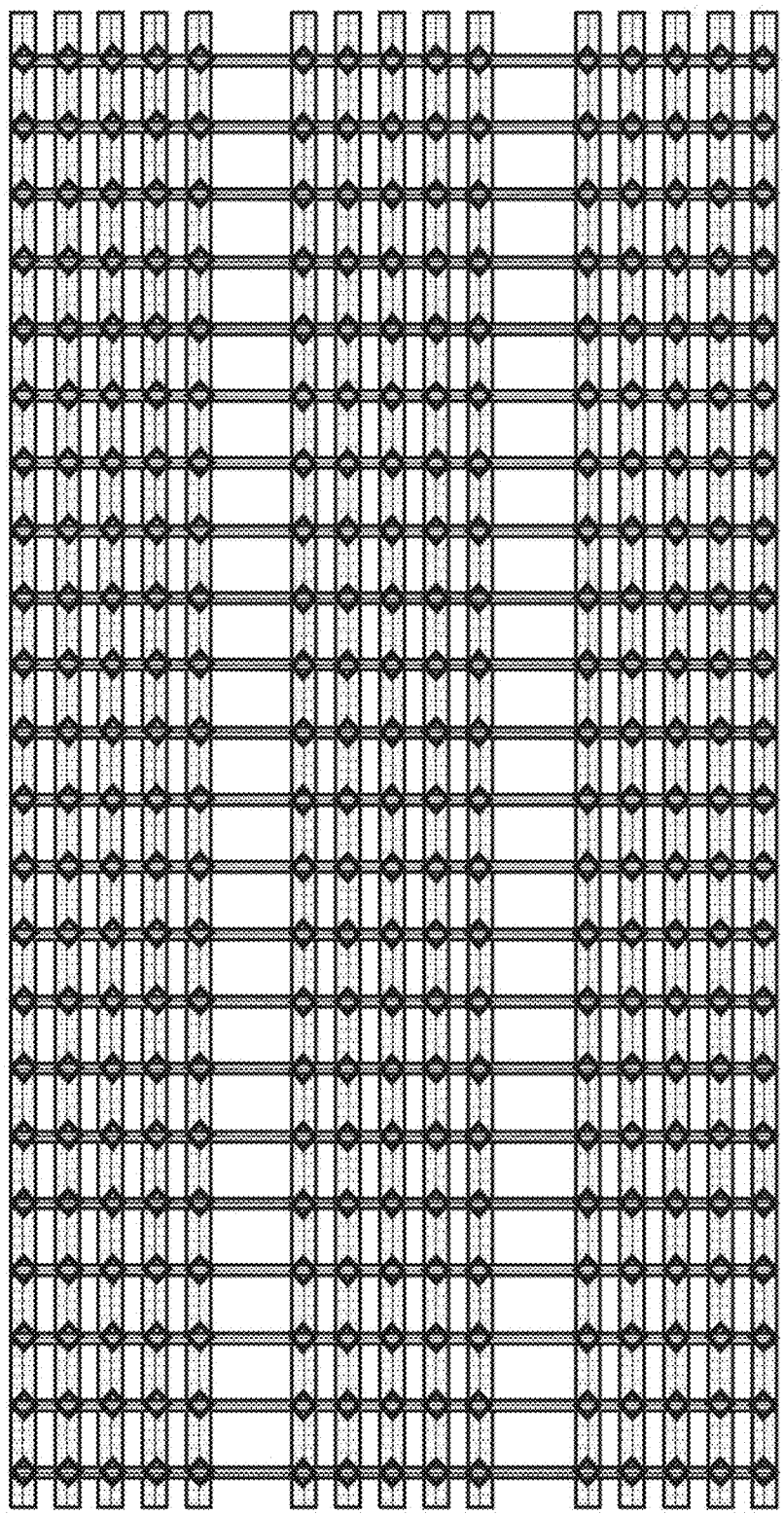
FIGS. 3-16 show various graphical user interfaces associated with a routing process according to an embodiment of the present disclosure.

Referring now to FIGS. 3-33, various graphical user interface examples and embodiments consistent with routing process 10 are provided. FIG. 3 shows an example graphical user interface 300 which is consistent with embodiments of routing process 10. GUI 300 depicts a graphical view of MO layer before routing. This is a graphical view of the MO layer on a sample design.

Embodiments of routing process 10 may utilize a routing graph, which is at the core of the grid-based system described herein. The term "graph", as used herein, may refer to a topological data structure that may be used in many different computing applications, composed of vertices and edges. A vertex is a node or nexus connecting one or more edges, and an edge is a passage connecting *two* nodes. As an example, on an unrouted chip, the unrouted pins located on the chip could be represented with a certain kind of graph, often called a minimum spanning tree (MST). The pins may be the vertexes, and the edges may be the connections between the pins. A router may use this information to make connections between the pins.

In contrast with the MST example, the routing graph described herein may represent the routable topology of a design by creating edges and vertices that correspond to the width-spacing patterns and tracks that are manufacturable. The manufacturing process prescribes that on one manufacturing layer, the tracks will have a horizontal or a vertical orientation, and typically they alternate between layers, e.g., M1 will be horizontal, M2 vertical, M3 horizontal again, etc. In some embodiments, our vertex may represent a literal point on a manufacturing layer of the design where the track of the current layer intersects with a track of the layer above or below. Then, correspondingly, our edge may represent a routable span between two vertices. Vertices may be placed at the intersections since this is the location where the router could route forward on the same layer or go up to the next layer or go down to the previous layer.

In some embodiments, the edges of the routing graph may connect two vertices. Each vertex is a point and a layer, however in order to comply with the track-based orthodoxy, they have to be "orthogonal". Thus, the two points/layers may always describe either a vertical (north/south), horizontal (east/west), or inter-layer (up/down) edge. In other words, only one coordinate may vary between two connected edges. This is the edge type, and it could always be inferred from the vertices themselves, but for efficiency/error-checking sake embodiments included herein may keep this information in the edge. There are no "diagonal" or "free" edges, because they are not manufacturable.

Typically, all edges on a given layer will be of the same type (horizontal/vertical), and invariably the edges that connect between layers may be referred to as interlayer edges. The horizontal/vertical edges may represent the locations of paths/path segments, and the up/down edges may represent the locations of vias (e.g., where the router connects a signal from one layer to another).

In some embodiments, the horizontal/vertical edges may have built-in track information that may provide what type of wire would be rendered (e.g., width, color, dimensions), and the inter-layer edges may also have built-in via information, that may provide what type of via would be used.

In some embodiments, routing process 10 may control how the router uses these edges with the use of a state attribute. In this way, the state of an edge may be considered as free, hidden, blockage, haloed, create, preroute, and routed. Free edges are those that may be available to the router. Hidden edges are not available to the router, and are a kind of utility edge for helping make graph-queries in a region work faster. Blockage edges represent a part of the graph that cannot be routed on, to or from. Haloed edges are edges that have been marked in the course of past routing to represent proximity restrictions on future routing (e.g., if a designer created a span of path segments on a particular signal net, the haloing that results constrains future routing in the proximity such that it must match that net (to allow connection) or prevent routing on a different net (to assure adequate spacing between different nets, in order to ensure DRC compliance).

In some embodiments, the states of blockage, create, preroute and routed may all be "occupied edge" states. The latter three will have further attribute data further describing the type of occupation such as the net being used or the type of via. (Typically, the router will be occupying edges in the course of routing by marking them with the 'create' state). The haloed state may be a constrained state, and it may conditionally transition to occupied (or free if the halo is removed). Free is unconstrained, and hidden is a "cannot-ever-be-occupied" state. After the router completes its work, all the edges that are marked 'create' may be flushed to the design database, they are re-dispositioned as 'routed'.

In some embodiments, the routing graph may be composed of edges and vertices and may include a virtual representation of the available routing space for all the routing layers. Width spacing pattern ("WSP") tracks for each routing layer may form the foundation of the routing graph. In operation, designers may utilize WSPs as graphical editing modes for generating circuit board tracks. WSP is a concept built to assist routers in performing DRC correct routing easily. Additional information regarding WSP and related technology may be found in U.S. Pat. Nos. 10,997, 351, 11,042,684, and 10,733,351 available from the Assignee of the present disclosure which are incorporated herein by reference in their entirety.

In some embodiments, pre-routed shapes and route segments on the tracks may be treated as occupied edges on the graph. Halos, or spacing influence regions, around these pre-route/routed segments may be treated as occupied or haloed edges on the graph. Any remaining unoccupied space on the tracks may be treated as free edges. Intersections between different layer tracks may be treated as intersection edges, potential via locations, and depending on its availability, the edge may be treated as either free/occupied.

In some embodiments, the routing graph may be dependent upon a particular PDK. It may absorb all DRC rules from the PDK and allow the router engine to remain PDK independent. The routing graph may be dynamic and may be updated when routing segments and vias are created.

In some embodiments, the routing graph may rely upon a plurality of different components. Some of these may include, but are not limited to, a segment service and a via service. These service components provide the routing graph with DRC correct halos around the respective design objects so that routing process 10 may update its edges accordingly.

Referring again to FIG. 3, the unrouted or unoccupied track spaces may be identified as free edges in the graph. The pre-routed/routed track spaces may be identified as occupied edges in the graph. The intersection between the M0 (horizontal) and M1 (vertical) tracks may be identified as interlayer edges and potential via edges. The area around the pre-route/routed segments where a DRC violation could occur may be identified as halo edges. There may be hidden edges connecting two adjacent tracks and these edges may be used for graph traversal.

Figure 4:
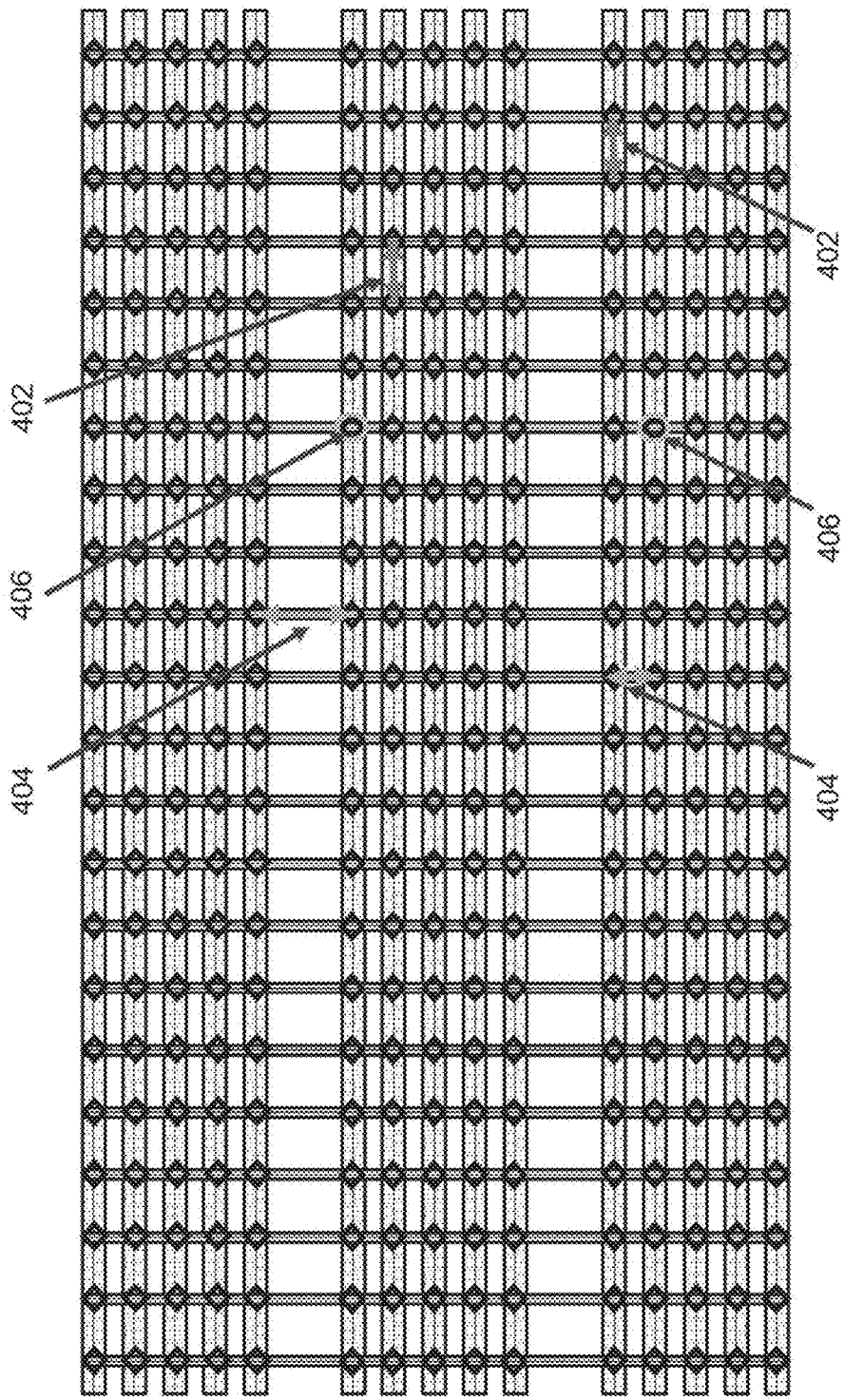

Referring also to FIG. 4, an example graphical user interface 400 which is consistent with embodiments of routing process 10 is provided. GUI 400 again depicts a graphical view of M0 layer before routing. In this example, edge 402 (e.g. free/busy/halo), hidden edge 404 between tracks that may be used for track traversal, and interlayer edges 406 (e.g. potential via edge) are displayed.

Figure 5:
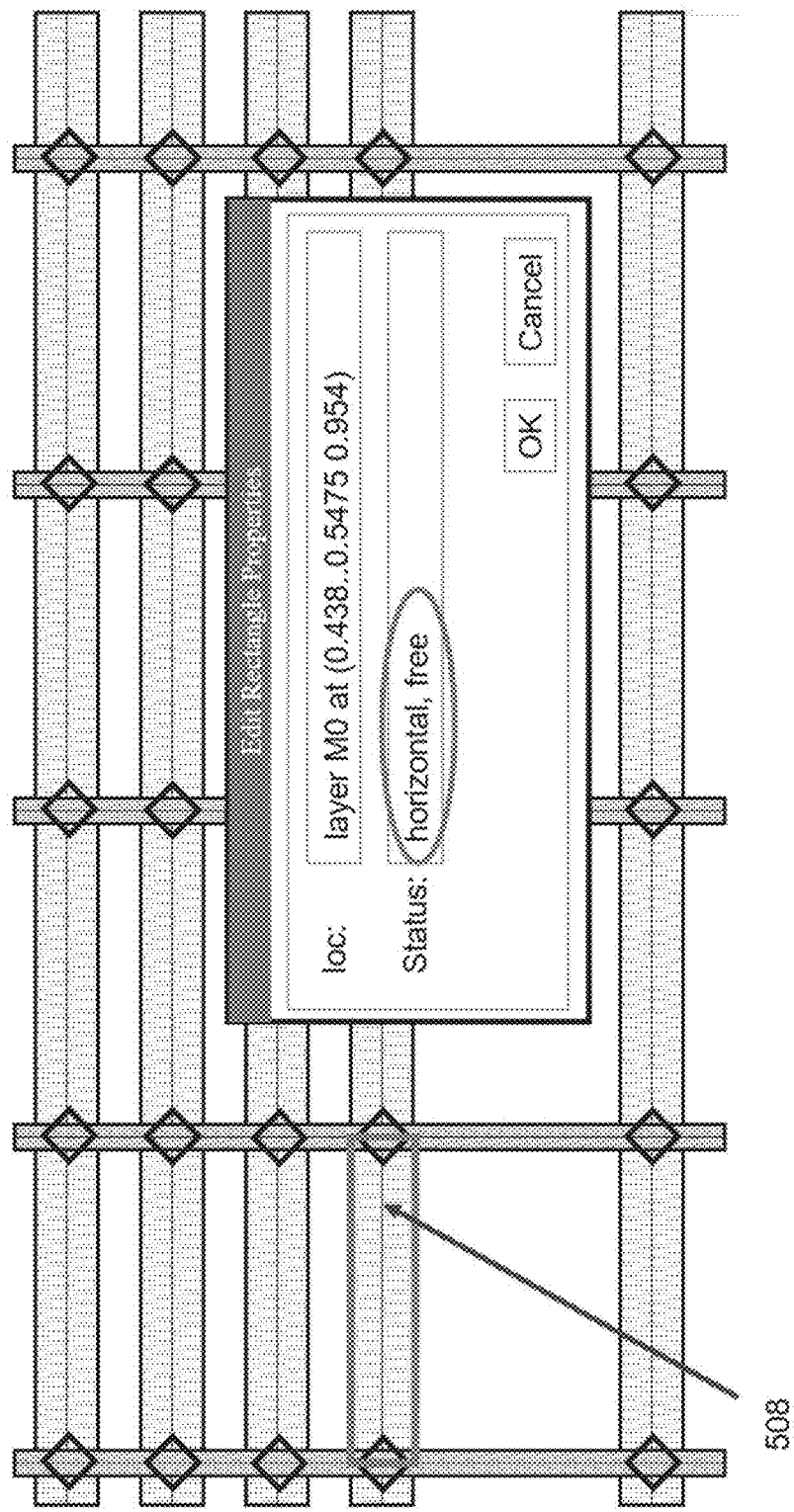

Referring now to FIG. 5, an example graphical user interface 500 which is consistent with embodiments of routing process 10 is provided. GUI 500 shows an example of a graphical view of a free edge. The highlighted free edge 508 is a legal track space. The router engine may be free to use this space for routing. The status of the edge is shown in the property window.

Figure 6:
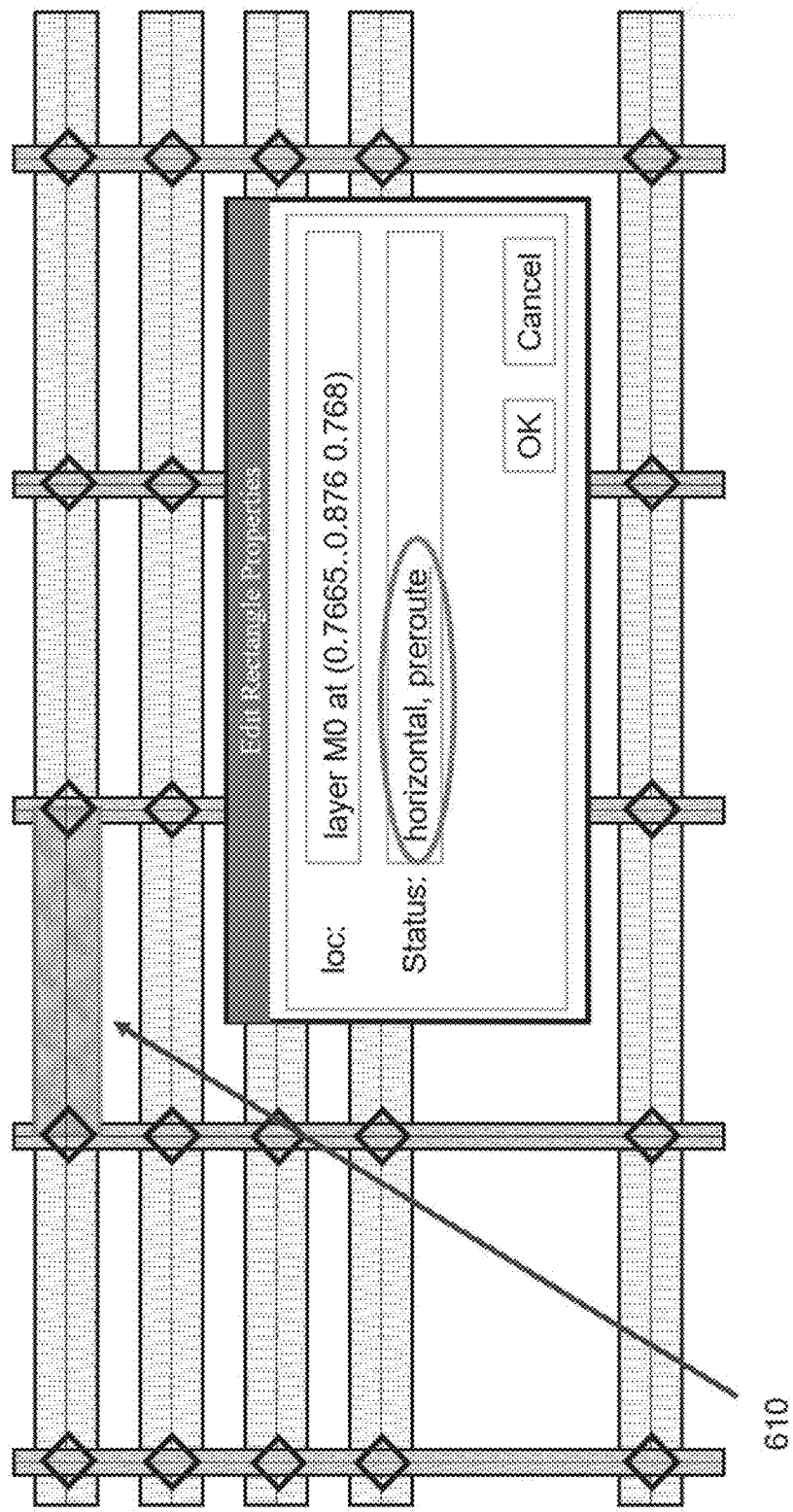

Referring now to FIG. 6, an example graphical user interface 600 which is consistent with embodiments of routing process 10 is provided. GUI 600 shows an example of a graphical view of a pre route edge. The highlighted pre-route edge 610 is an occupied track space. The router engine cannot use this space for routing. The status of the edge is shown in the property window.

Figure 7:
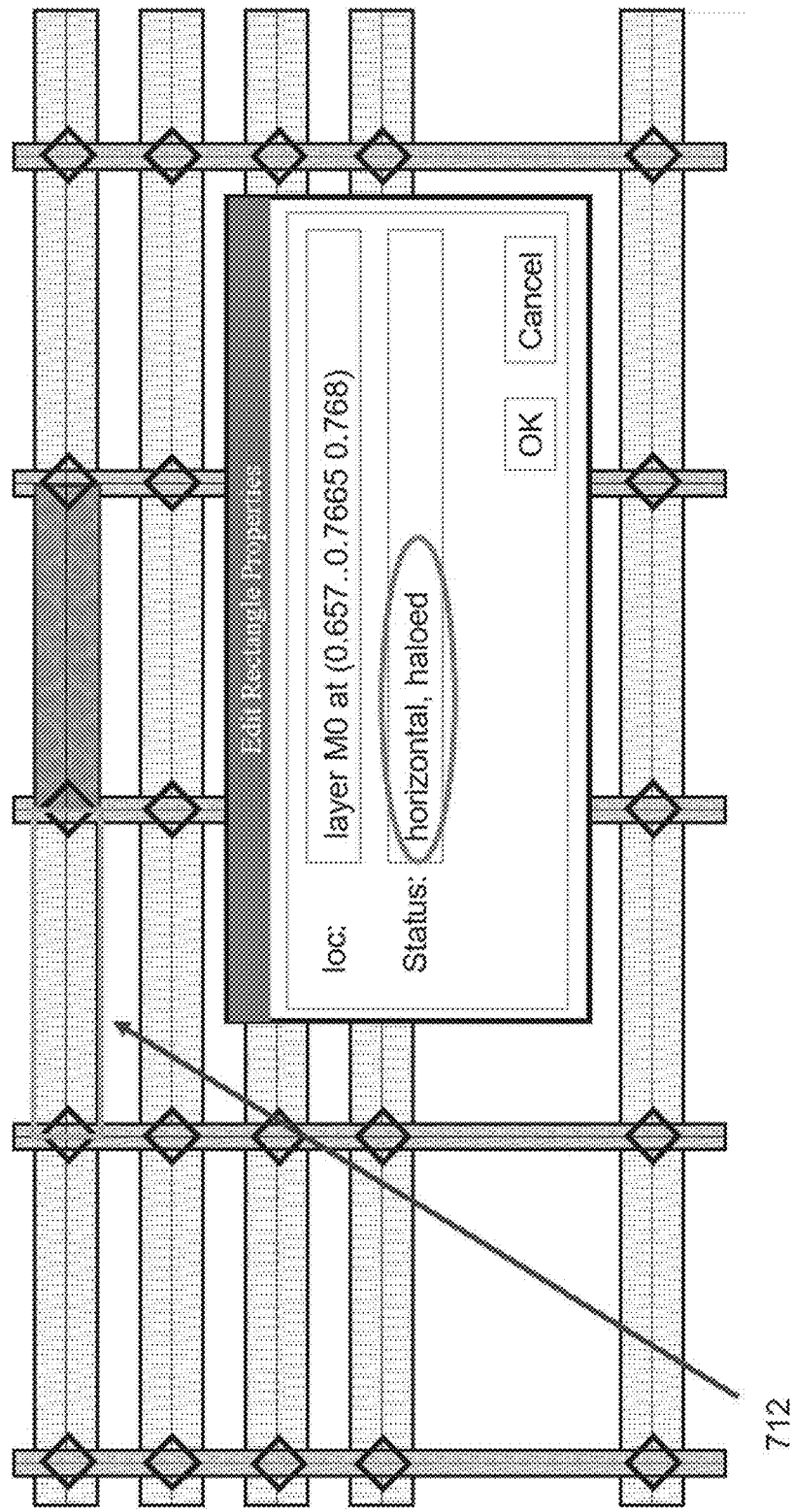

Referring now to FIG. 7, an example graphical user interface 700 which is consistent with embodiments of routing process 10 is provided. GUI 700 shows an example of a graphical view of a halo edge 712 to the left of the pre-route edge. The highlighted halo edge is an invalid/illegal track space. The potential spaces around the route segments which are prone to DRC violations are identified as halo edges. The graph may use service components which may run through a set of design rules to calculate the spacing halos.

Figure 8:
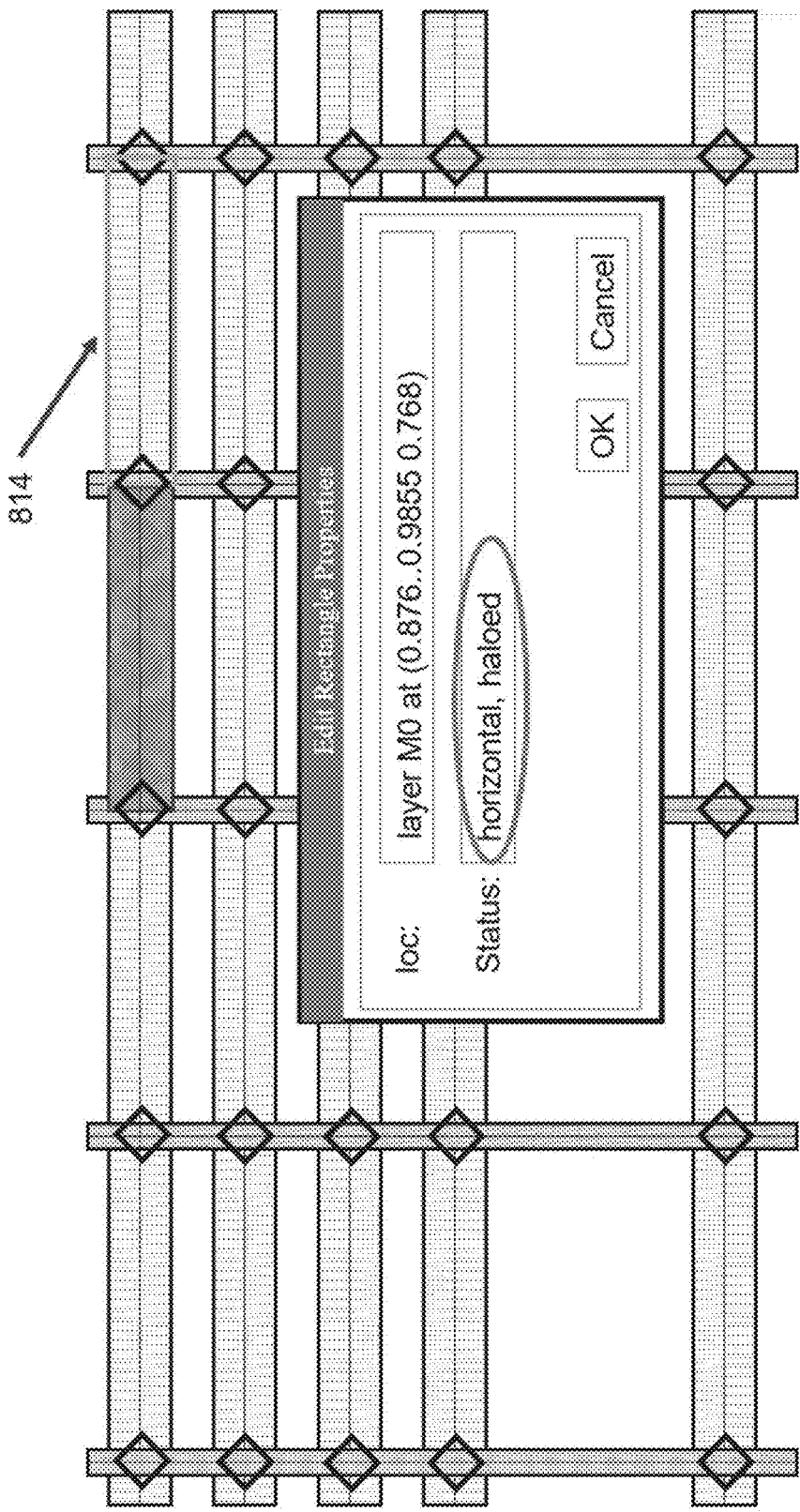

Referring now to FIG. 8, an example graphical user interface 800 which is consistent with embodiments of routing process 10 is provided. GUI 800 shows an example of a graphical view of a halo edge 814 to the right of the pre-route edge.

Figure 9:
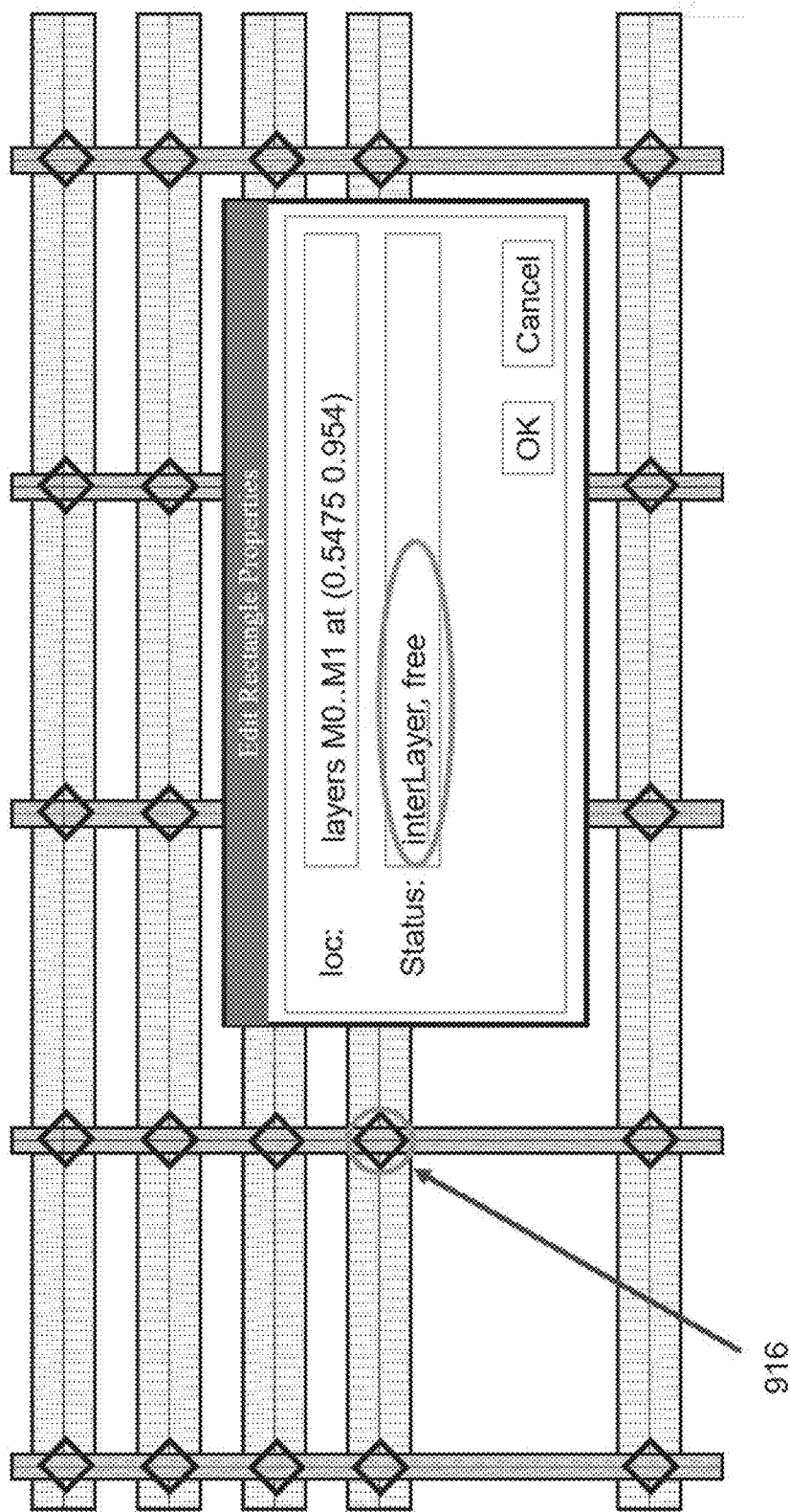

Referring now to FIG. 9, an example graphical user interface 900 which is consistent with embodiments of routing process 10 is provided. GUI 900 shows an example of a graphical view of an interlayer edge 916 representing the via layer. In this example, the highlighted interlayer edge is the intersection between the M0 and M1 tracks. This is where a V0 via object may be created, depending on whether it is free or occupied. The interlayer edge shown in FIG. 9 is free/unoccupied as implied in the property window. For a routed via the edge would be marked occupied.

Figure 10:
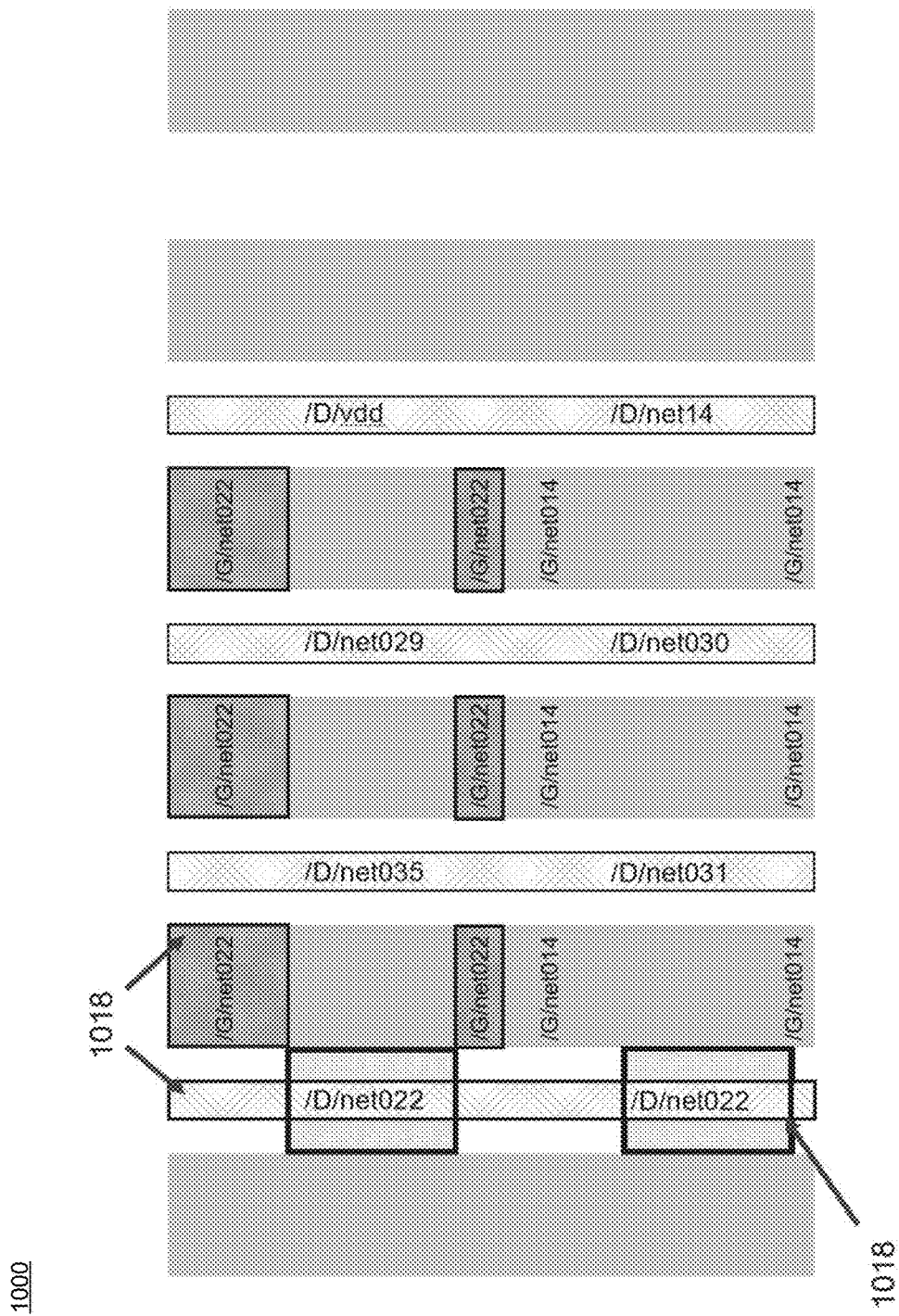

Referring now to FIG. 10, an example graphical user interface 1000 which is consistent with embodiments of routing process 10 is provided. GUI 1000 shows an example of a graphical view showing the pins 1018 for a particular net (e.g. "net022") prior to routing.

Figure 11:
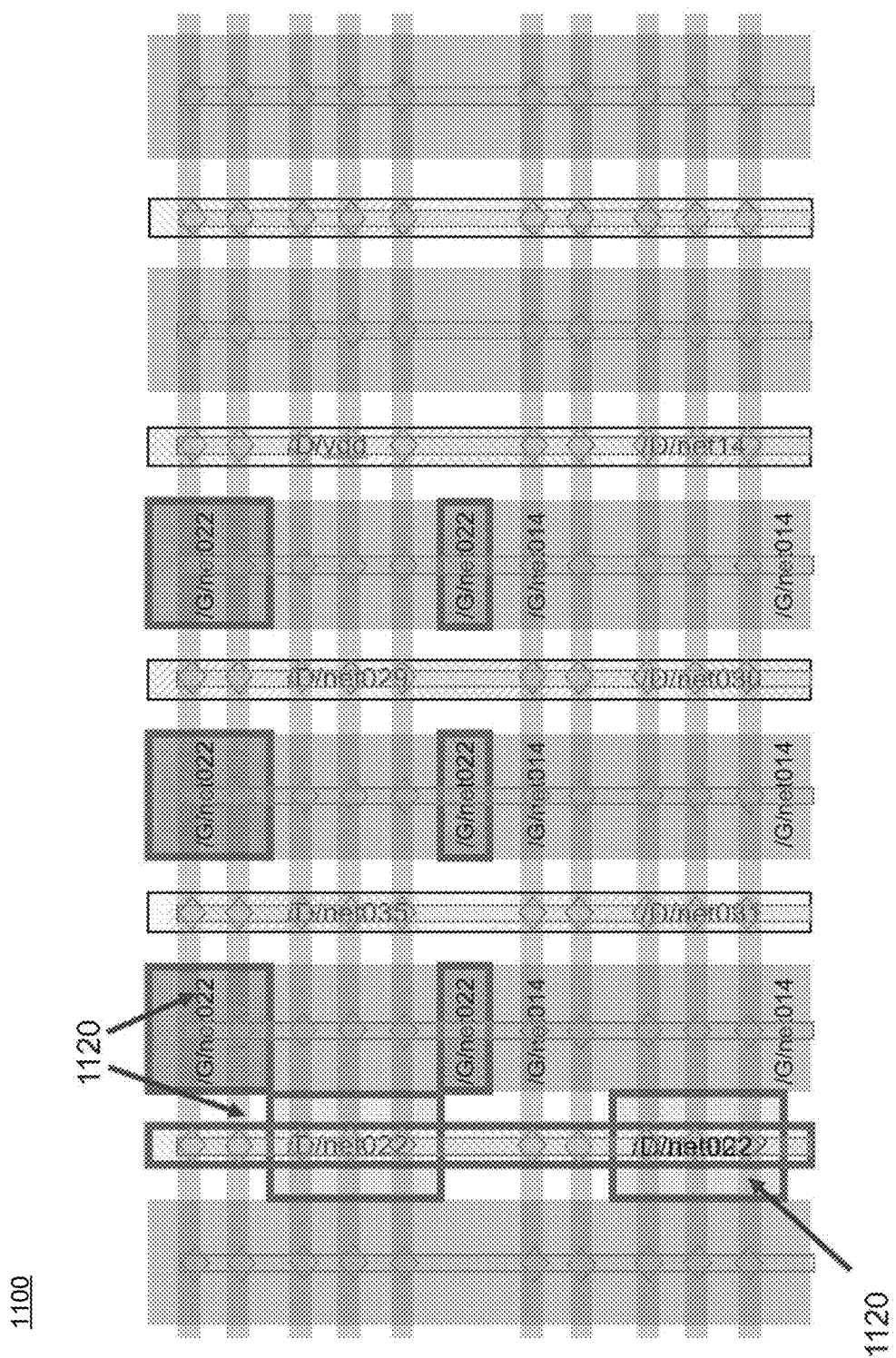
Figure 12:
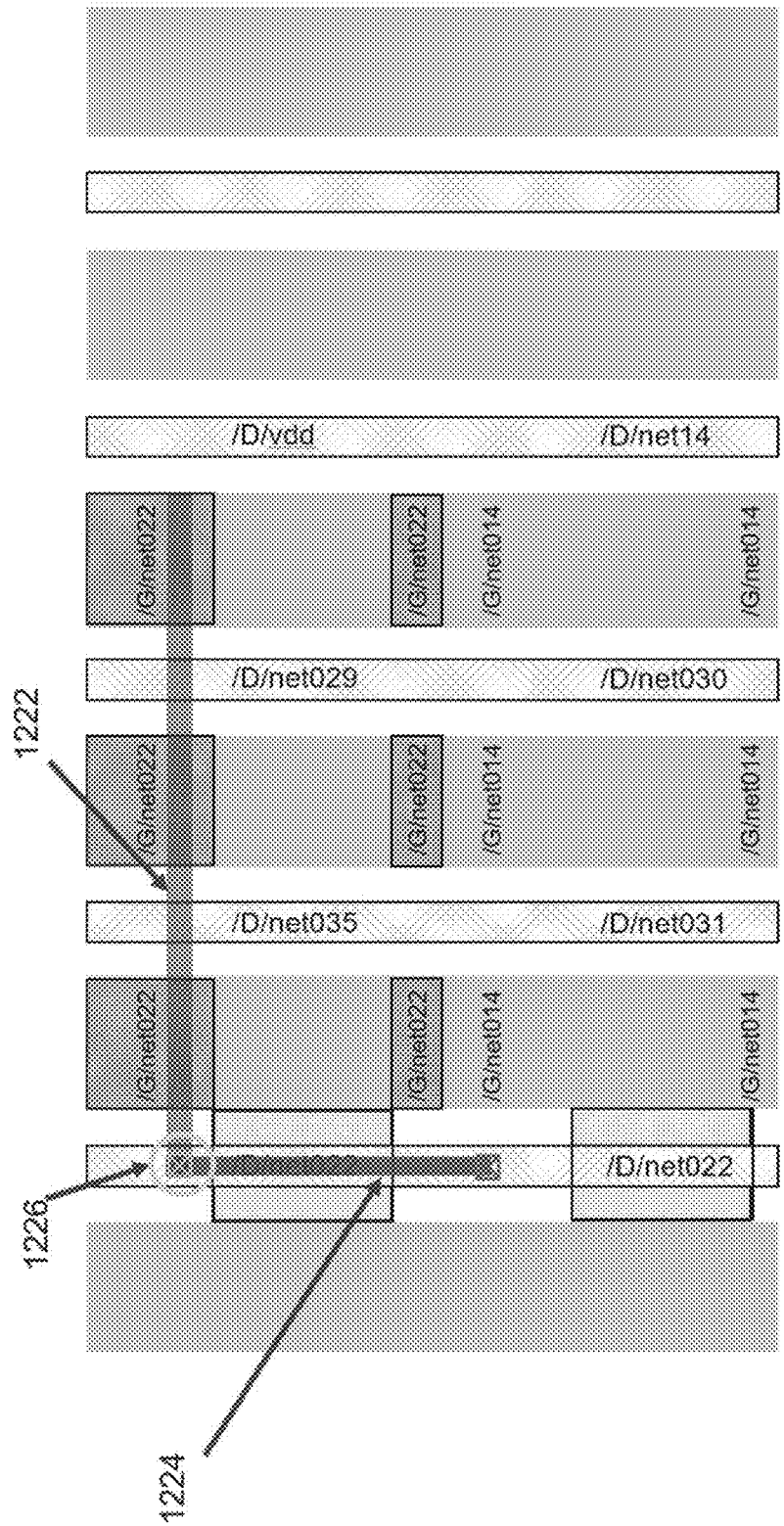

Referring now to FIGS. 11-12, example graphical user interfaces 1100 and 1200 which are consistent with embodiments of routing process 10 is provided. GUI 1100 shows an example of a graphical view showing M0 graph edges 1120 around net022 before routing and FIG. 12 shows net022 after routing. In FIG. 12, M0 segment 1222, M1 segment 1224, and V0 via 1226 are displayed.

Figure 13:
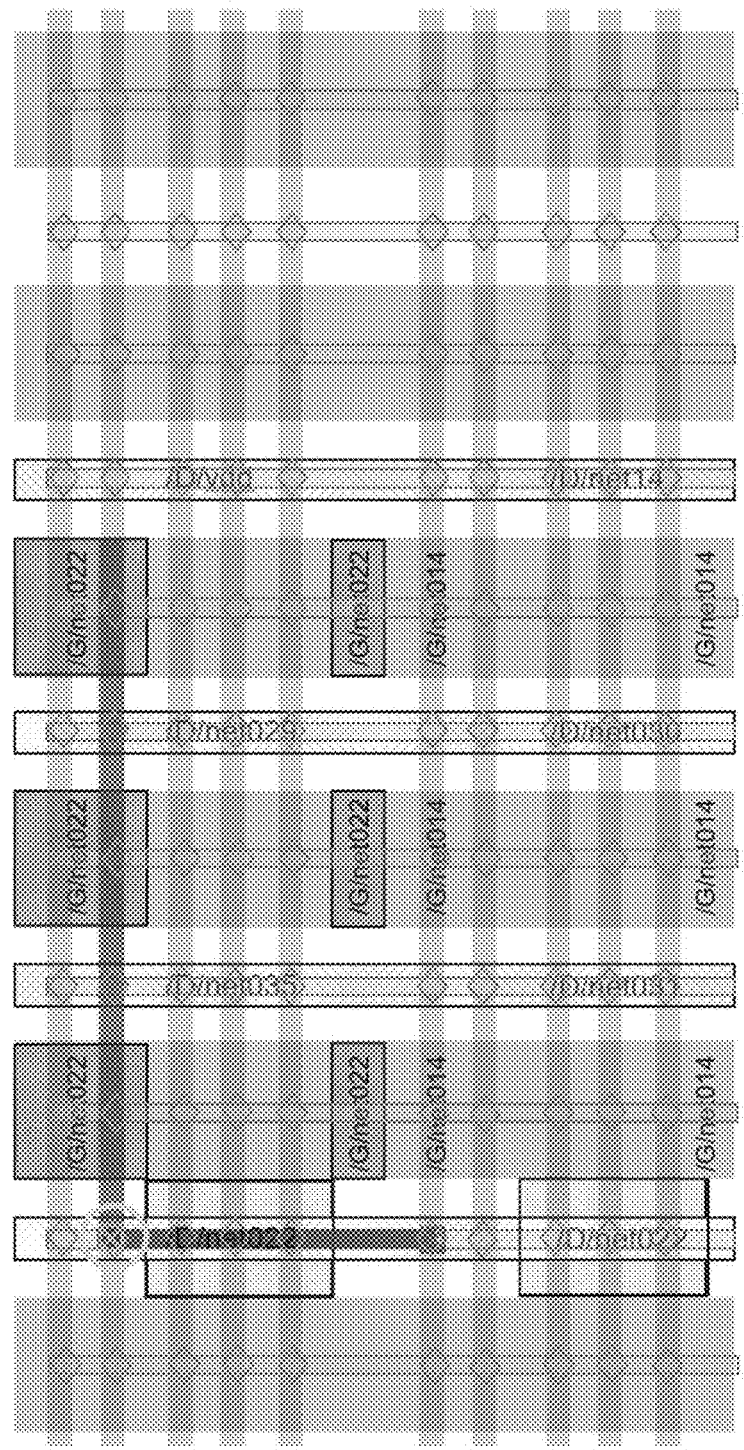

Referring now to FIG. 13, an example graphical user interface 1300 consistent with embodiments of routing process 10 is provided. GUI 1300 shows an example of a graphical view of M0 graph edges around net022 after routing. In this example, after routing is performed, the routing graph may update the edges along the M0 and M1 routed segments as free, halo and occupied edges. The segment halos and via halos may be identified for the route segments and vias respectively through the service components. All edges representing the route segment space may be marked as occupied. The edges overlapping the halos may be updated to be halo edges. All other edges may be left untouched.

Figure 14:
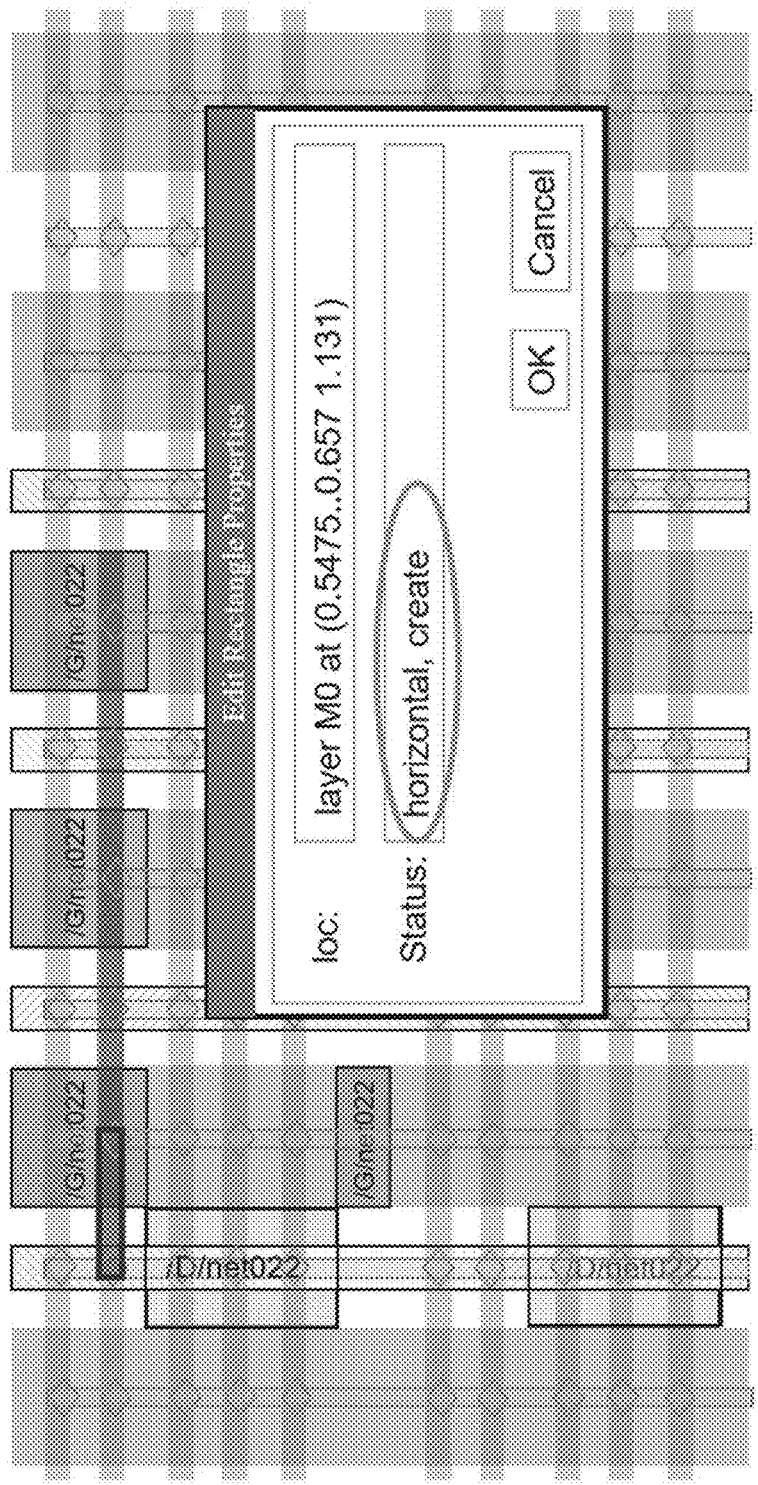

Referring now to FIG. 14, an example graphical user interface 1400 consistent with embodiments of routing process 10 is provided. GUI 1400 shows an example of a graphical view showing routed M0 net022 segments in the routing graph. The routed M0 segment shown is identified as a create or occupied edge.

Figure 15:
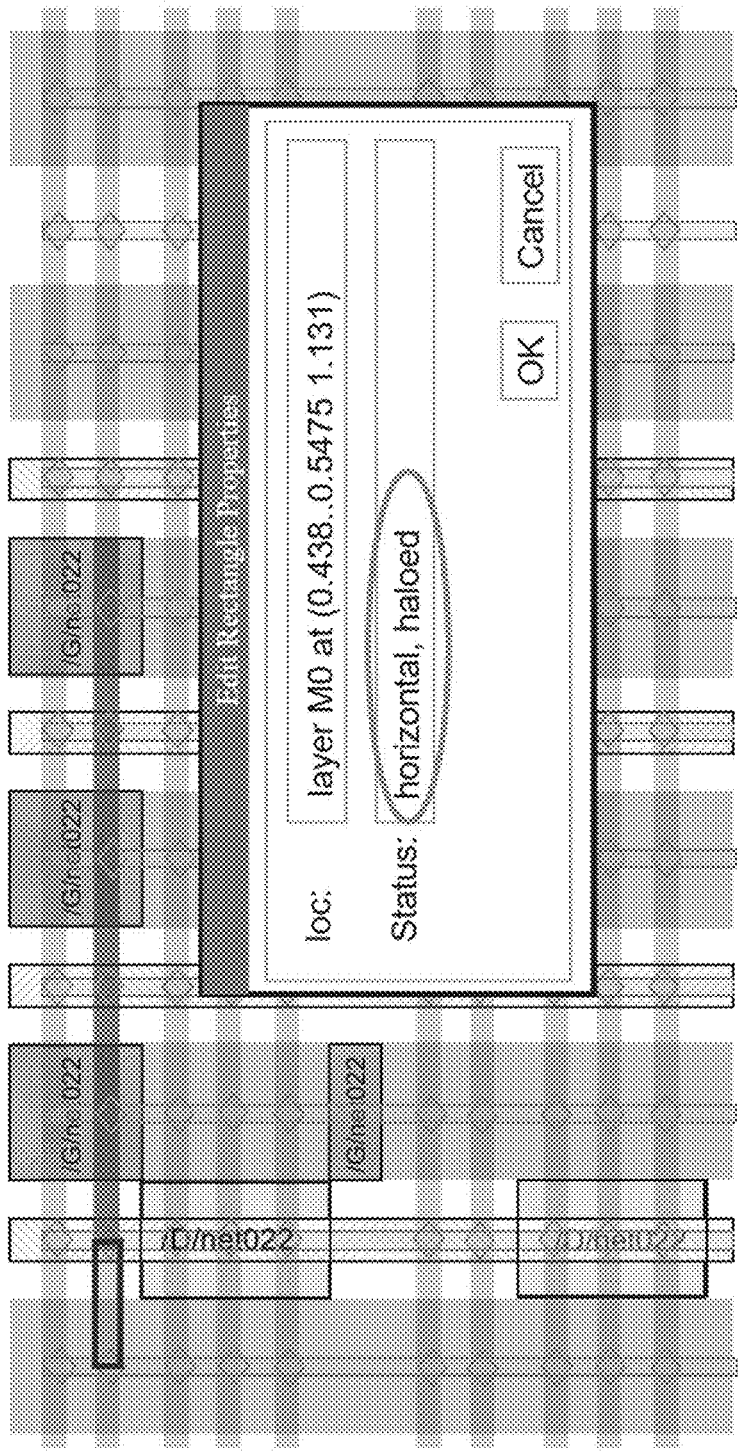

Referring now to FIG. 15, an example graphical user interface 1500 consistent with embodiments of routing process 10 is provided. GUI 1500 shows an example of a graphical view showing halo edges along routed M0 net022 segments in the routing graph. The DRC violation prone space next to the routed M0 segment of net022 may be updated to be a halo edge.

Figure 16:
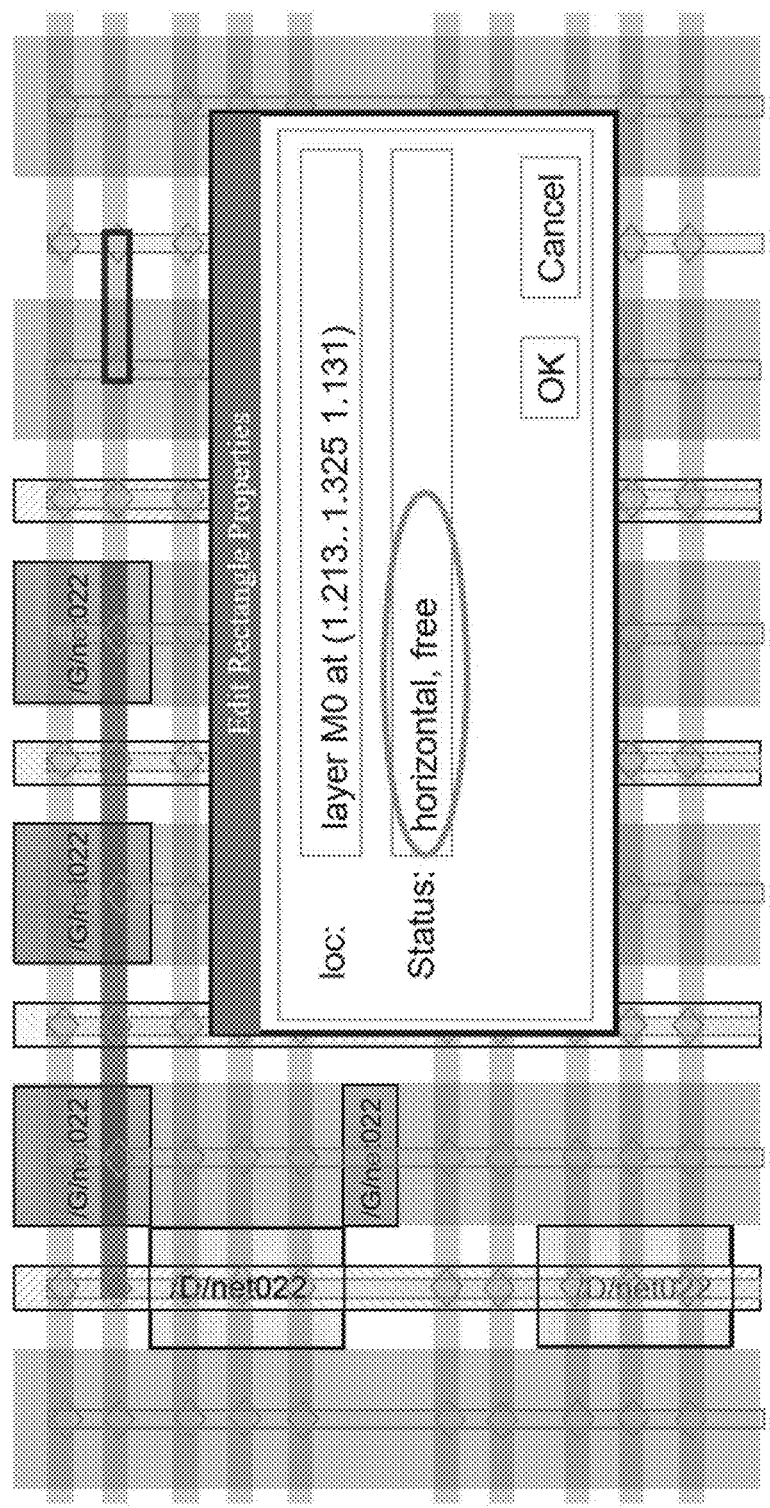

Referring now to FIG. 16, an example graphical user interface 1600 consistent with embodiments of routing process 10 is provided. GUI 1600 shows an example of a graphical view showing free M0 edges next to haloed edges. In this example, the space next to the haloed edge is free for routing and is left as a free edge.

Figure 17:
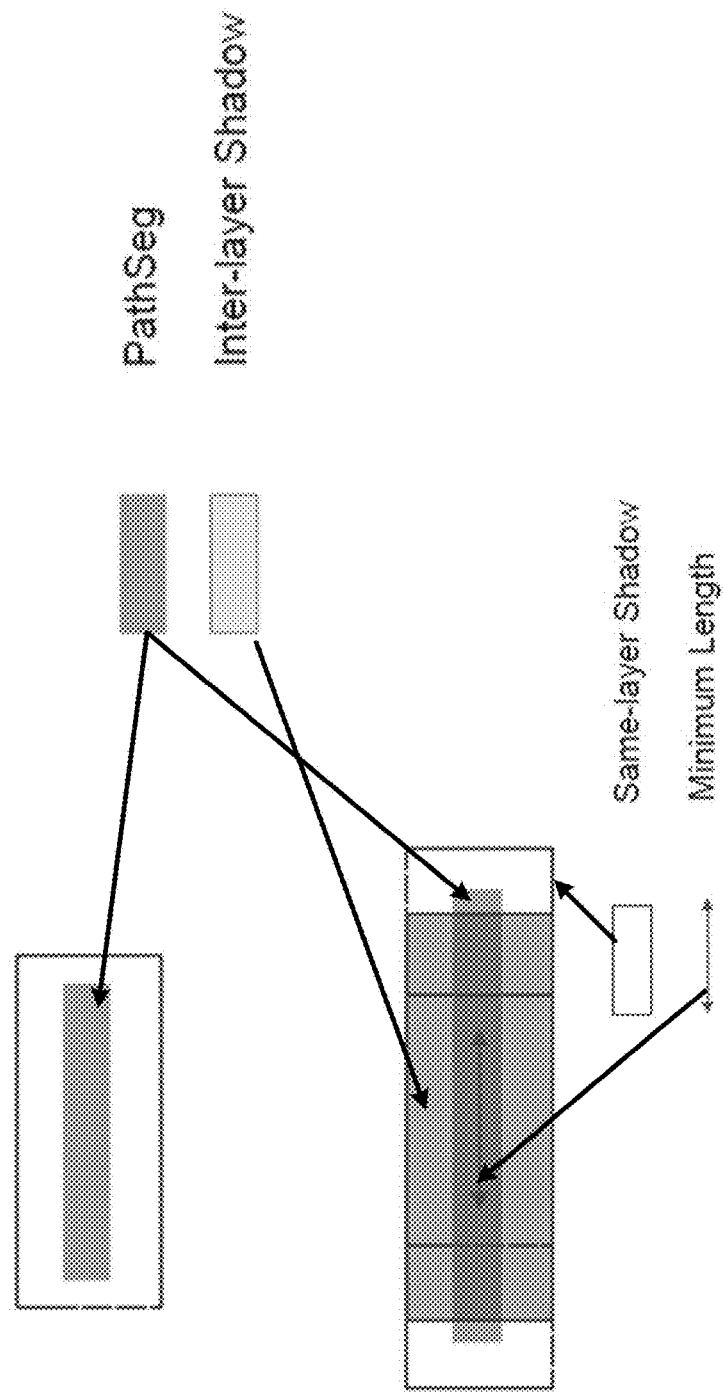
FIGS. 17-19 show examples of segment service and via service modules associated with a routing process according to an embodiment of the present disclosure.

Referring now to FIG. 17, an example graphical user interface 1700 consistent with embodiments of routing process 10 is provided. GUI 1700 shows an example of a segment service module. The segment service module may include cached constraints and segment shadows/halos. Some cached constraints may include, but are not limited to, minArea, minLength, minSpacing, EOL, minSpanLength-Spacing, etc. For a short segment, there may only be one shadow box for the routing graph to mark occupied. Shape shadows may be needed on two ends of a segment only if it exceeds minimum length related constraints. Two same-layer and one inter-layer shadows boxes may be returned for the routing graph to mark as occupied.

Figure 18:
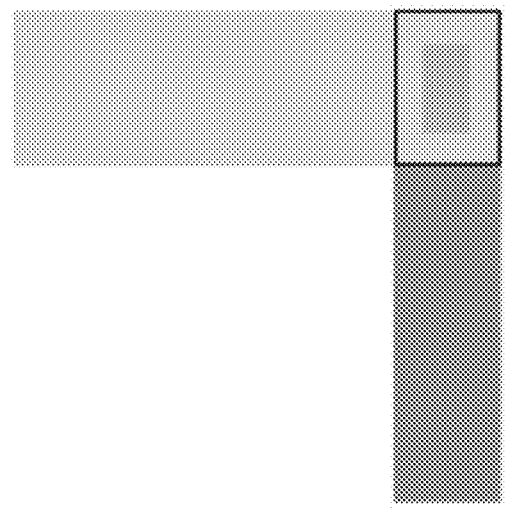
Figure 18:
Figure 18:

Referring now to FIG. 18, an example graphical user interface 1800 consistent with embodiments of routing process 10 is provided. GUI 1800 shows an example of a via service module. The via service module may provide the router with the best via to use for a given layer and width pair. The clearance "shadows" or "halos" for a given via guarantee DRC correctness with other potential shapes. FIG. 18 shows an example depicting the best via to use.

In some embodiments, routing process 10 may utilize various files (e.g., JavaScript Object Notation "JSON", etc.), which may be used to provide information for vias, segments, etc. The router may both write and read to these files. The intent when writing to these files is to document the different types of spacing halos used on each relevant layer, and to allow for the user to edit them. If one or both of the files exists, the router may read them and any halos given will override what the router would have determined internally.

Figure 19:
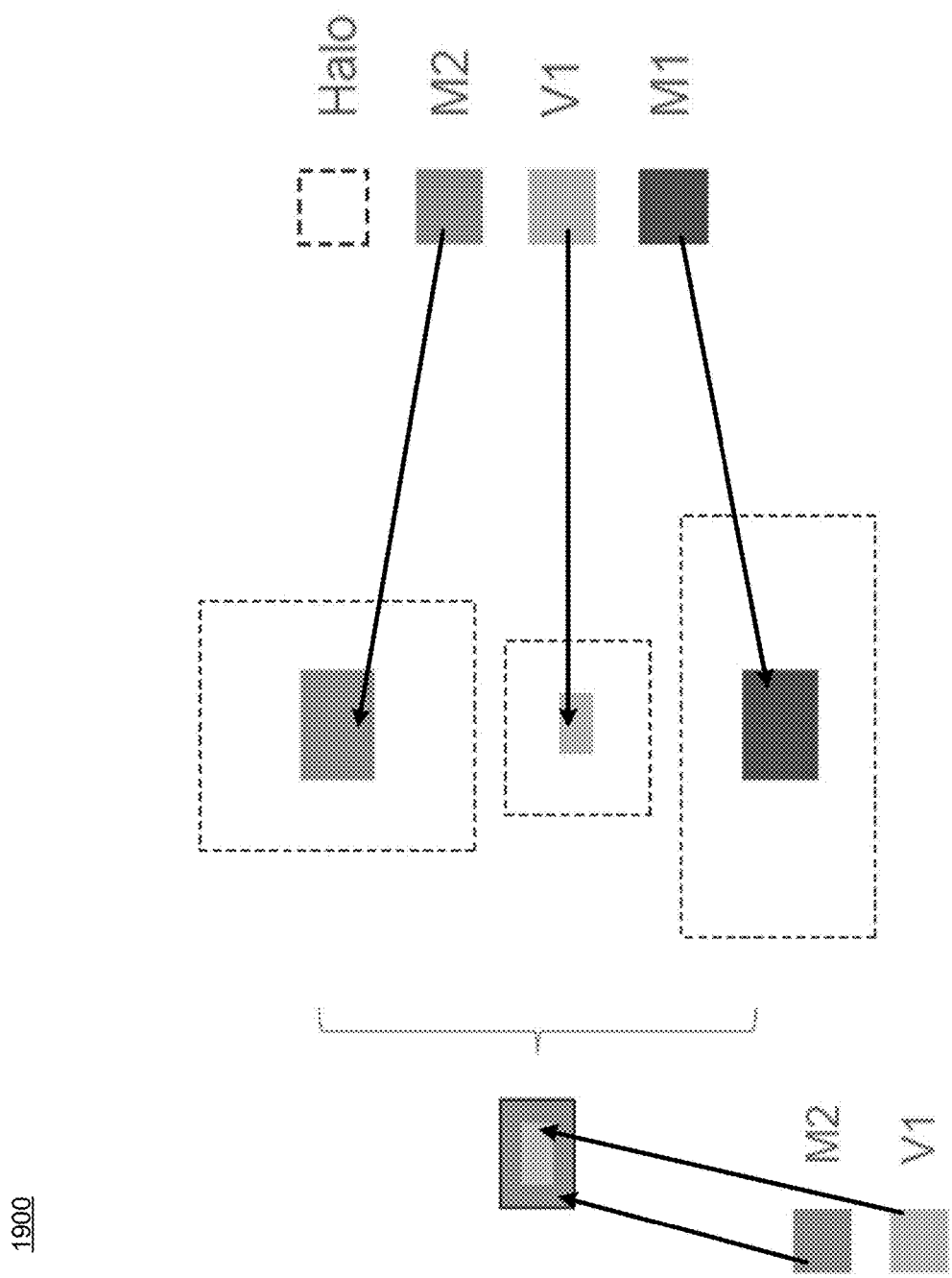

Referring now to FIG. 19, an example graphical user interface 1900 consistent with embodiments of routing process 10 is provided. GUI 1900 shows an example of a via service module. In this example, same-mask halos may be generated and applied for each layer as shown in FIG. 19. Similarly for diff-mask, same-net, and diff-net halos.

Figure 20:
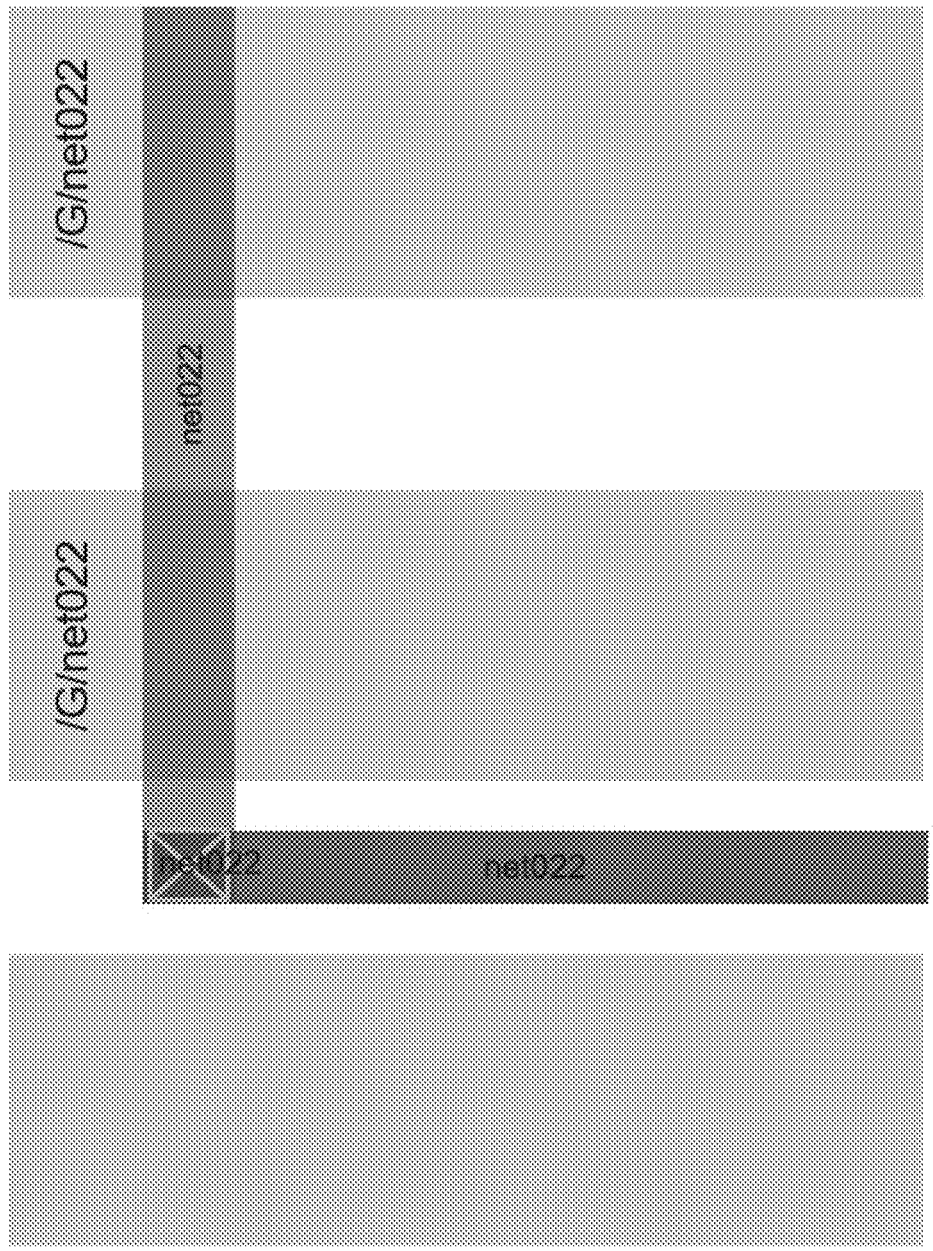
FIGS. 20-27 show various graphical user interfaces associated with a routing process according to an embodiment of the present disclosure.

Referring now to FIG. 20, an example graphical user interface 2000 consistent with embodiments of routing process 10 is provided. GUI 2000 shows an example depicting service components. This particular example shows a routing example having M0, M1 segments with V0.

Figure 21:
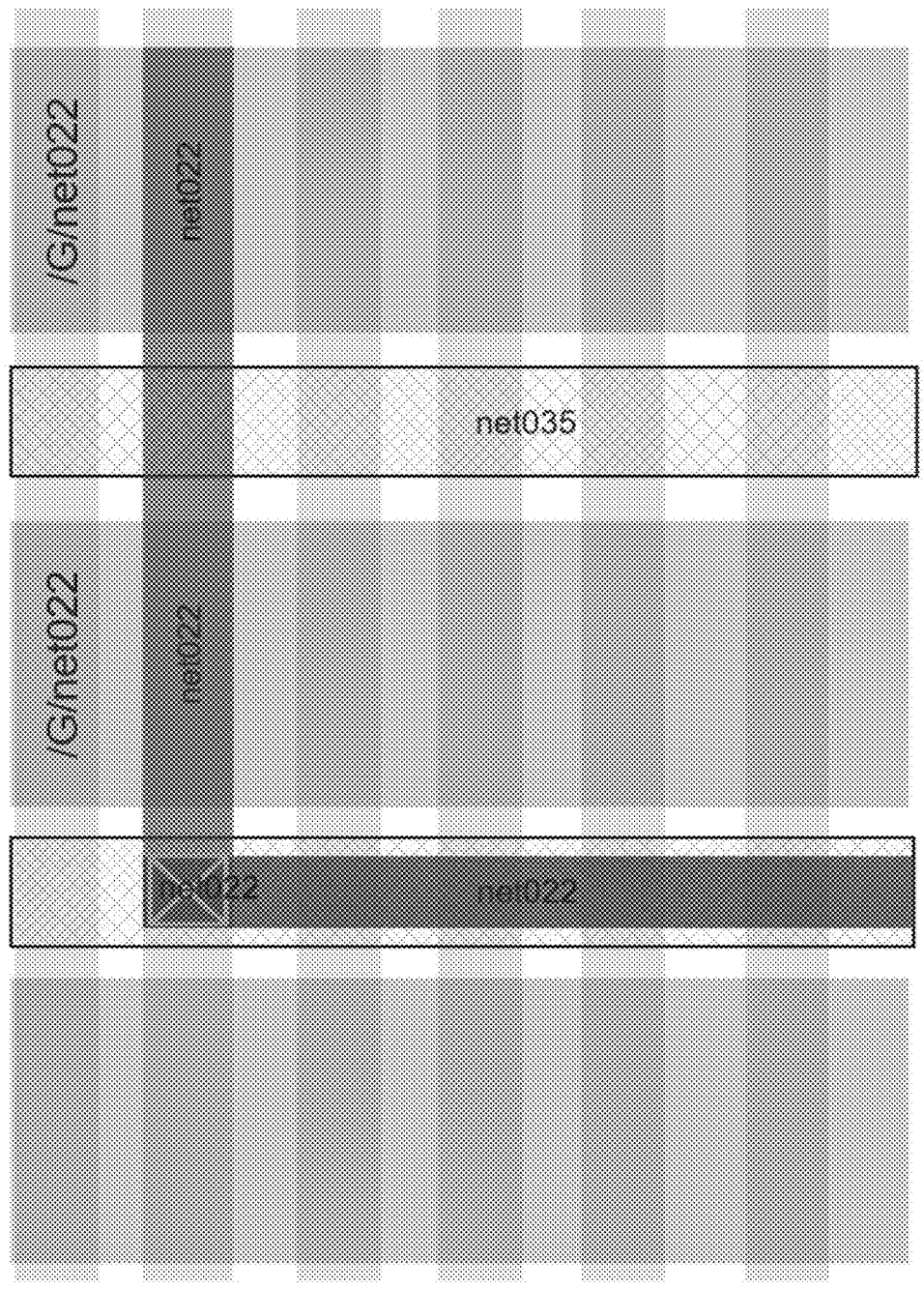
Figure 22:
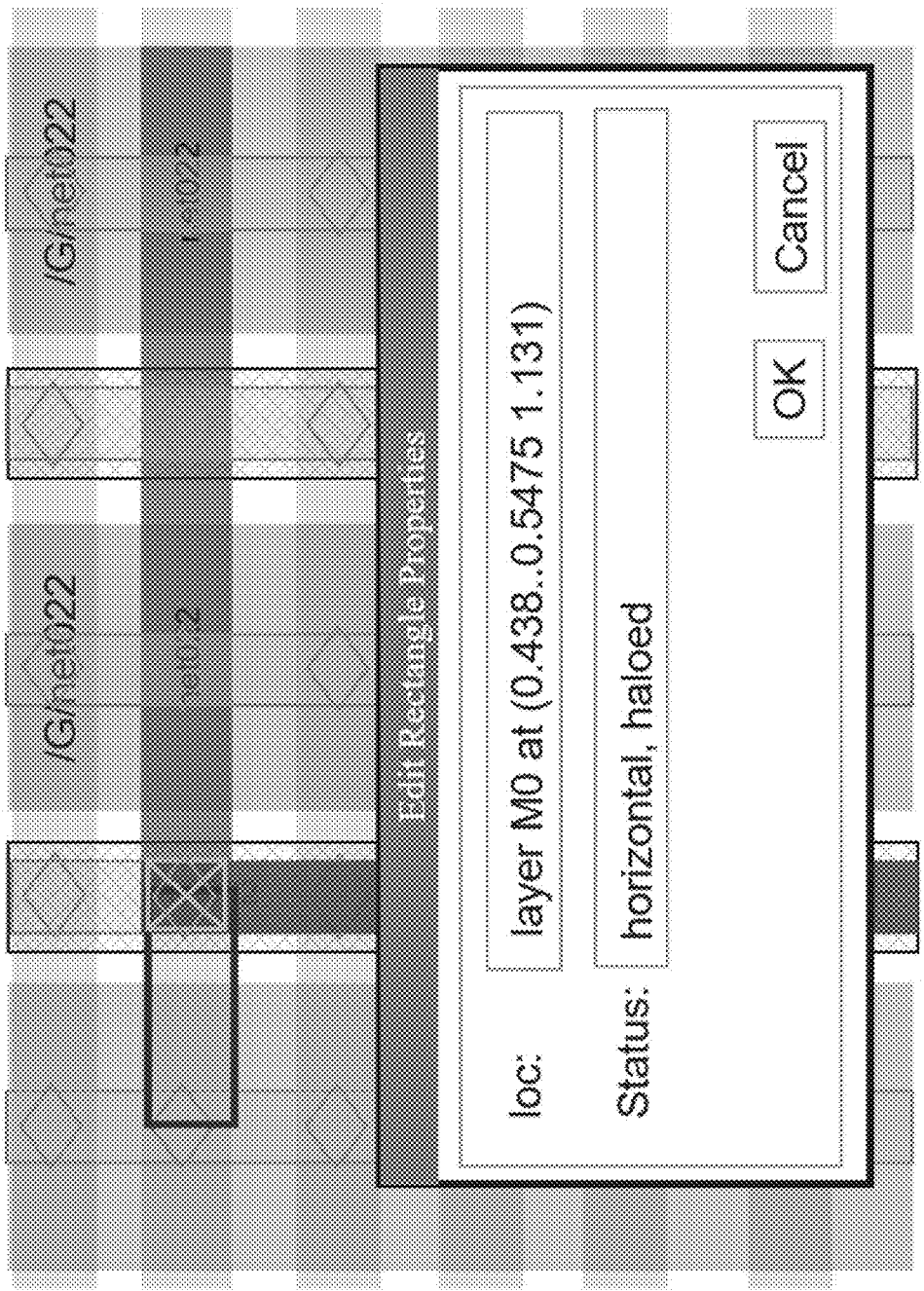

Referring now to FIG. 21-22, example graphical user interfaces 2100 and 2200 consistent with embodiments of routing process 10 are provided. GUI 2100 shows an example depicting service components and halos. In this example, the service component may be used to calculate M0, M1 and V0 halos, which will be reflected in the routing graph. The M0 halo is shown in FIG. 21 and reflected in the graph in FIG. 22.

Figure 23:
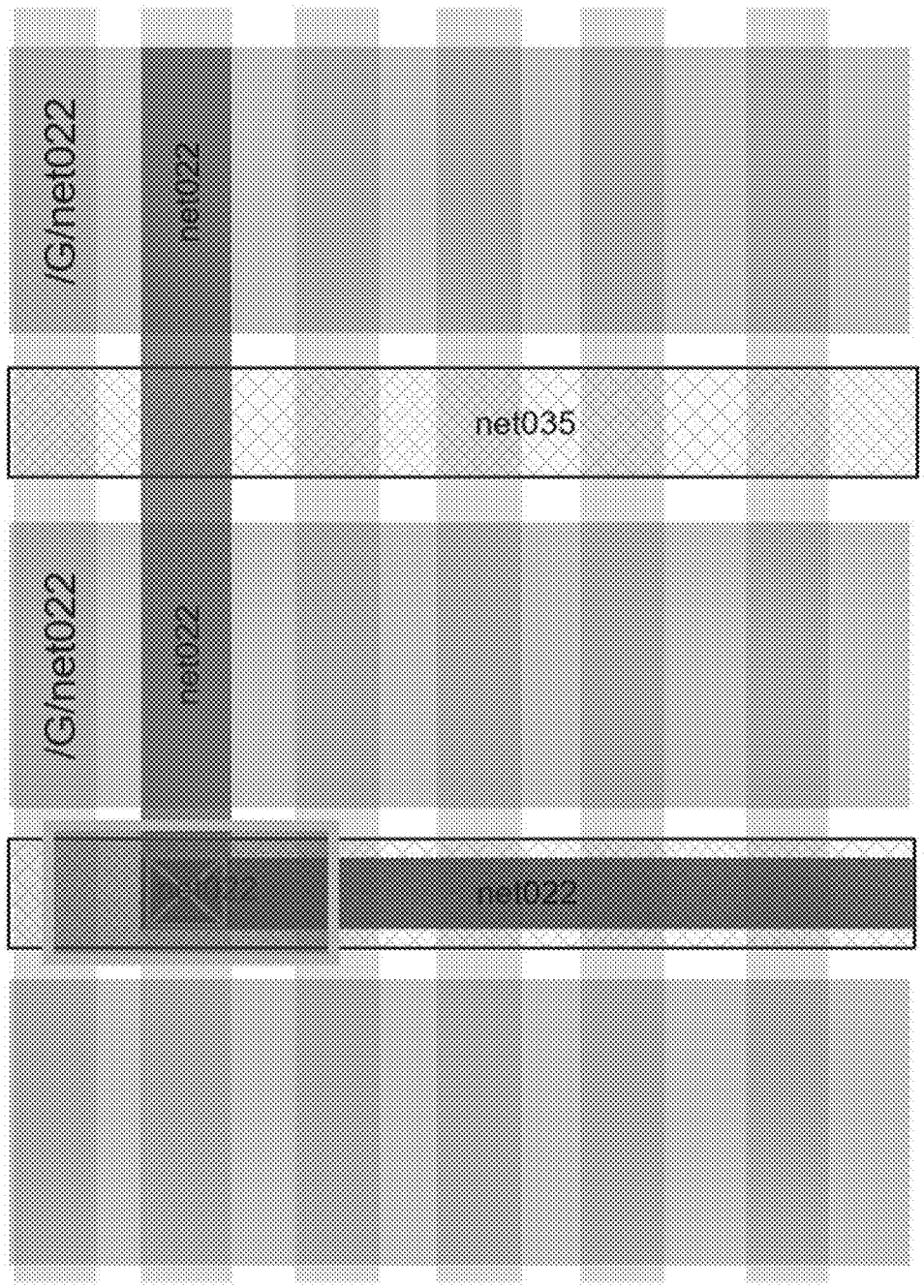
Figure 24:
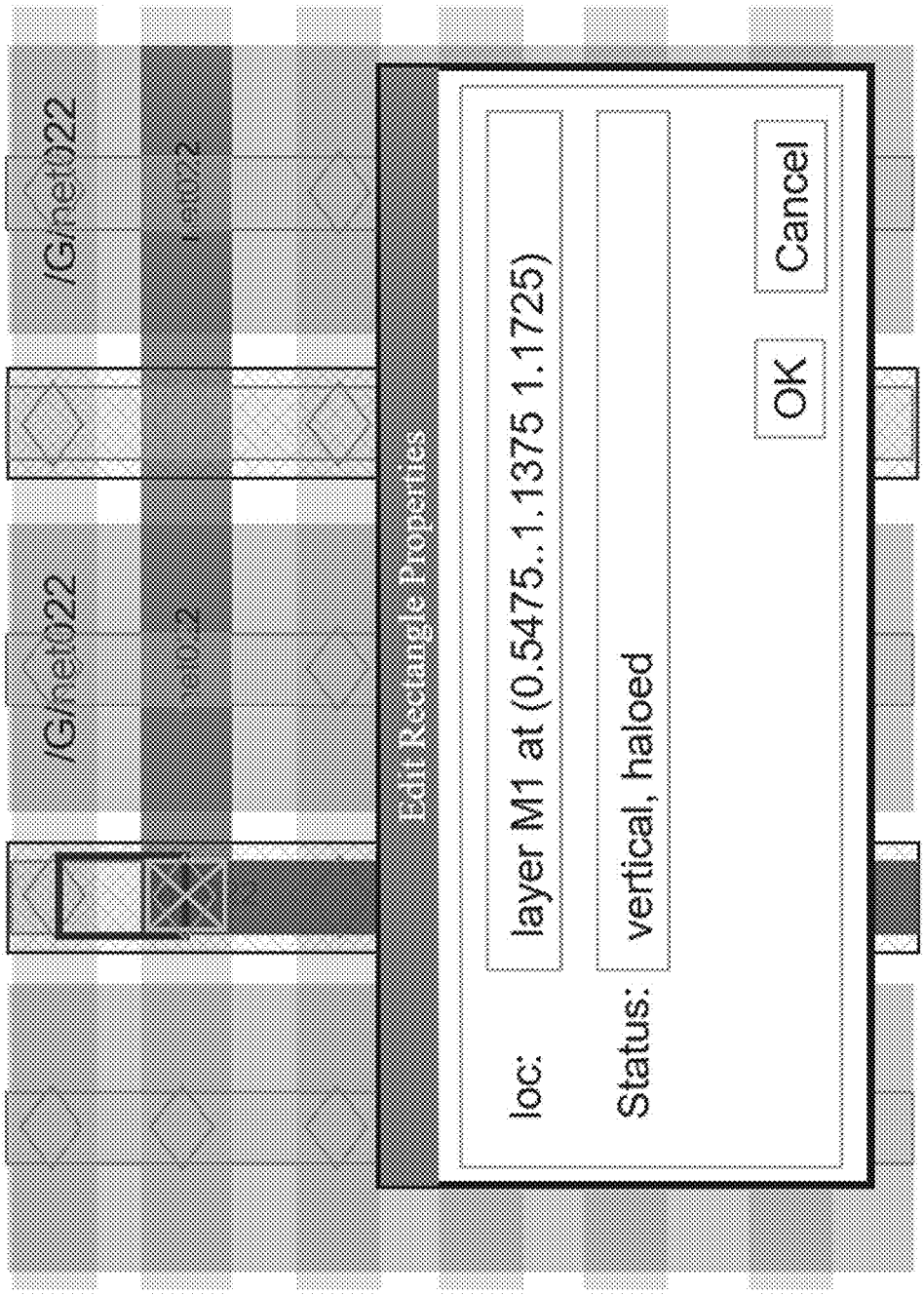

Referring now to FIG. 23-24, example graphical user interfaces 2300 and 2400 consistent with embodiments of routing process 10 are provided. GUI 2300 shows an example depicting service components and halos. The M1 halo is shown in FIG. 23 and reflected in the graph in FIG. 24.

Figure 25:
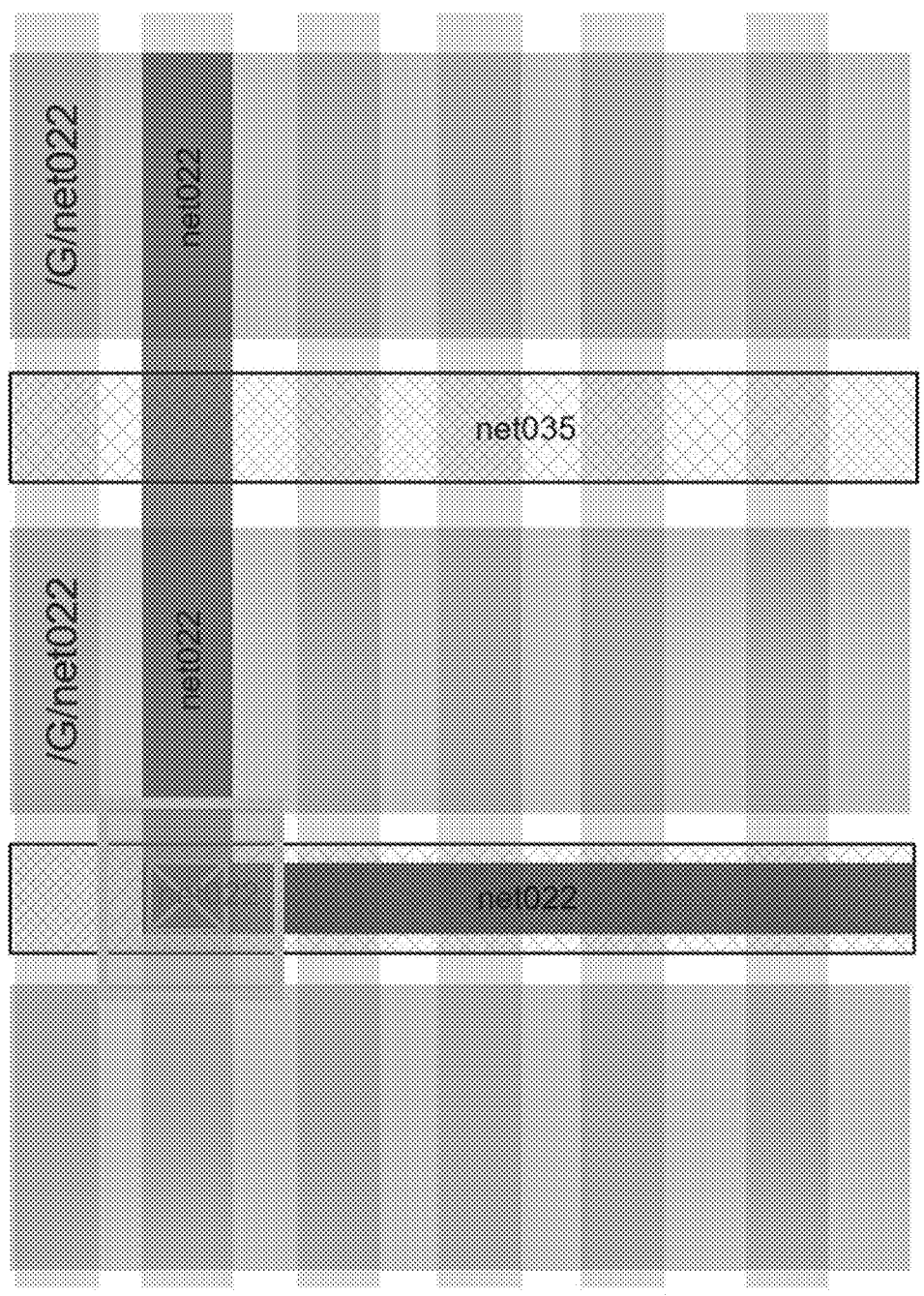
Figure 26:
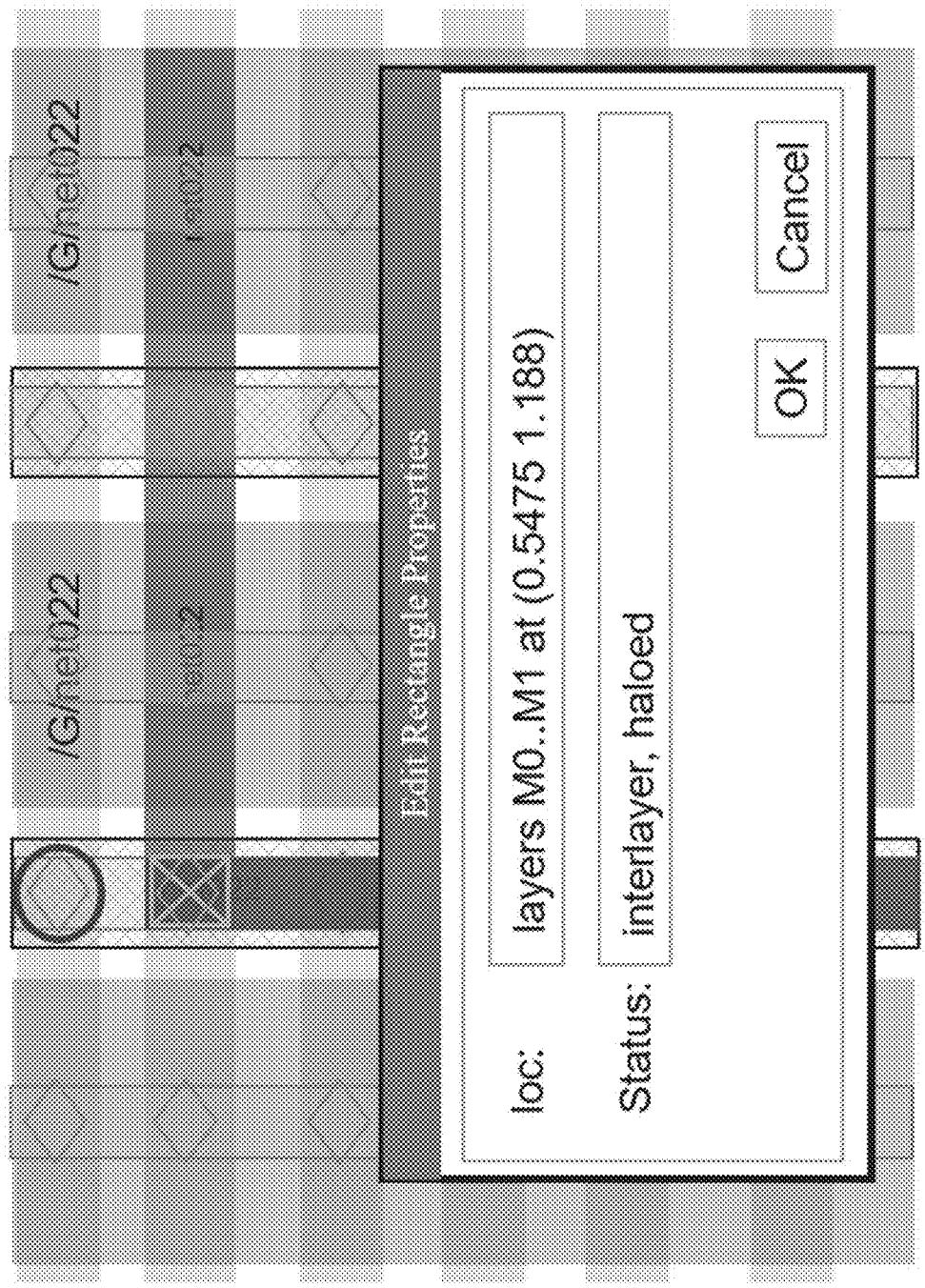
Figure 27:
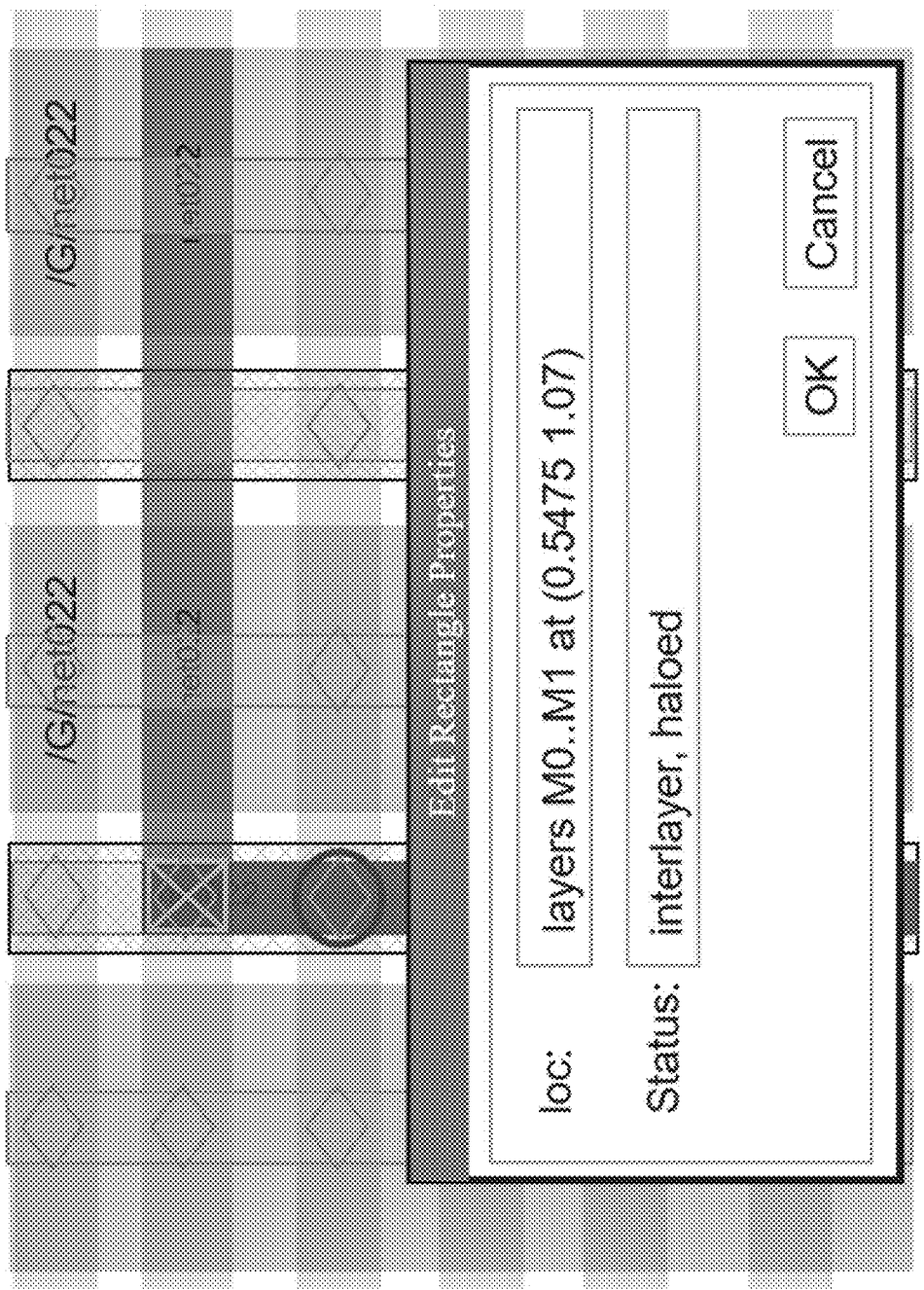

Referring now to FIG. 25-27, example graphical user interfaces 2500, 2600, and 2700 consistent with embodiments of routing process 10 are provided. GUI 2500 shows an example depicting service components and halos. The V0 halo is shown in FIG. 25 and reflected in the graph in FIG. 26. Via edges on the adjacent tracks are haloed in this example because of the M1 halos. V0 halo is shown reflected in the graph in FIG. 27 as well.

Figure 28:
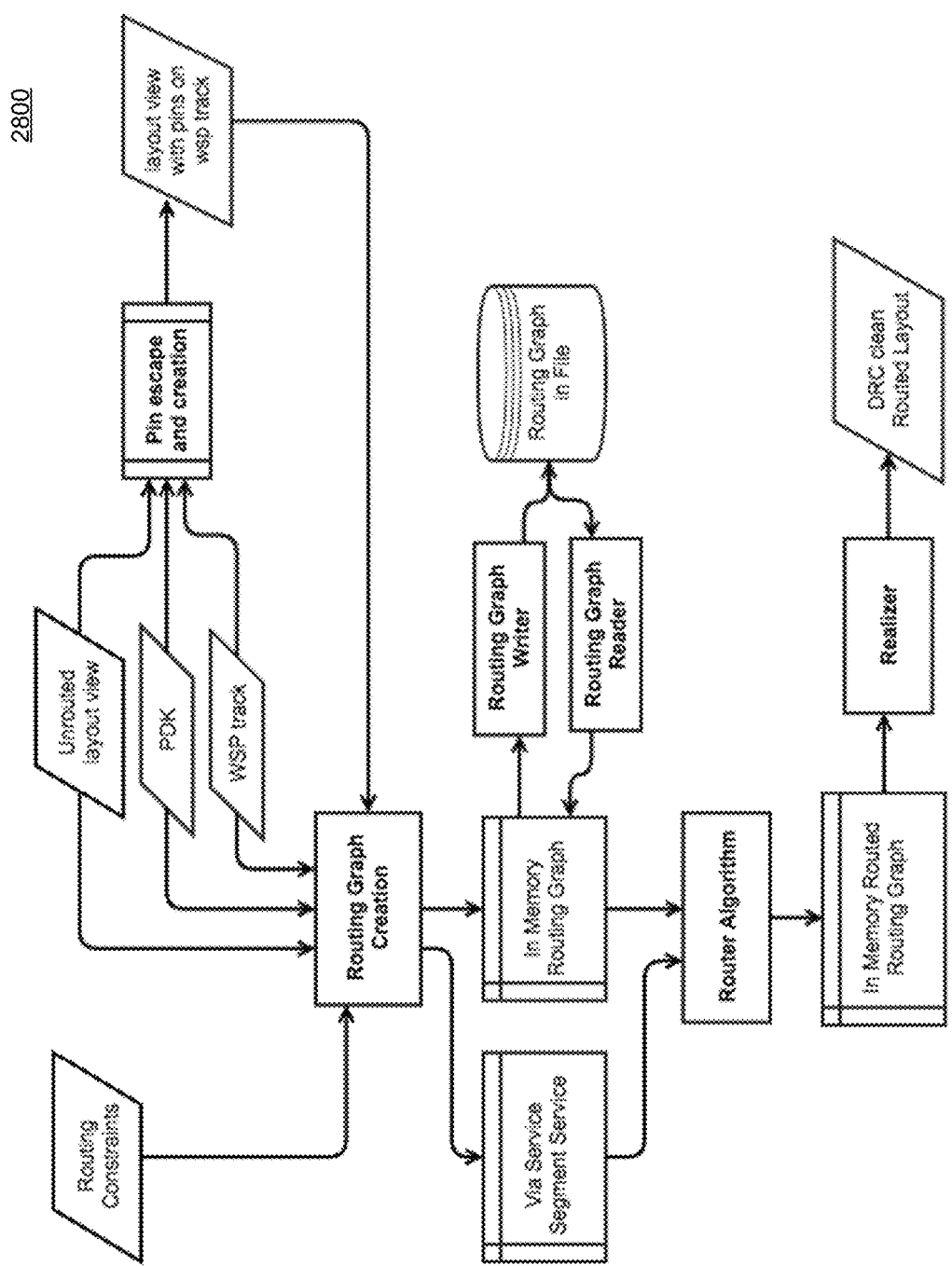
FIG. 28 is an exemplary flowchart of a routing process according to an embodiment of the present disclosure.

Referring now to FIG. 28, a flowchart 2800 depicting operations consistent with embodiments of routing process 10 is provided. The routing algorithms take as input the routing graph with edges that represent the coordinates that can be used when creating new path segments for each net. When routing a given net, the routing engine may search the graph to generate the shortest DRC-clean path from a given pin to another pin belonging to that net. Each time a path is found between two pins, the edges in that path may be changed to the create state, and surrounding edges may be haloed according to the segment or via service. The routing engine continues connecting one pin at a time until all pins for the given net are routed, or no new paths can be found.

It will be apparent to those skilled in the art that various modifications and variations can be made in the embodiments of the present disclosure without departing from the spirit or scope of the invention. Thus, it is intended that embodiments of the present disclosure cover the modifications and variations of this invention provided they come within the scope of the appended claims and their equivalents.

What is claimed is:

1. A computer-implemented method comprising:
   receiving, using a processor, an electronic design library including a plurality of design rules;
   generating a routing graph, based upon, at least in part, the plurality of design rules, wherein the routing graph is a virtual representation of all of the available routing space for all routing layers associated with an electronic design, wherein the routing graph is based upon, at least in part, one or more width spacing pattern ("WSP") tracks for each routing layer, wherein a WSP track specifies a minimum spacing between one or more tracks in the electronic design or a minimum width of any shape associated with a given track; and
   dynamically updating the routing graph at a graphical user interface, based upon, at least in part, a creation of a routing segment or a via at the graphical user interface.

2. The computer-implemented method of claim 1, wherein the routing graph includes one or more edges and one or more vertices.

3. The computer-implemented method of claim 1, further comprising:
   identifying at least one pre-routed shape or route segment on the one or more WSP tracks.

4. The computer-implemented method of claim 3, further comprising:
   generating a spacing influence region around the at least one pre-routed shape or route segment.

5. The computer-implemented method of claim 4, further comprising:
   analyzing the remaining unoccupied space on the one or more WSP tracks.

6. The computer-implemented method of claim 4, wherein generating a spacing influence region is based upon, at least in part, a segment service analysis.

7. The computer-implemented method claim 4, wherein generating a spacing influence region is based upon, at least in part, a via service analysis.

8. The computer-implemented method of claim 7 wherein the via service provides a router with an optimal via to satisfy a design rule check analysis.

9. The computer-implemented method claim 1, further comprising:
   identifying at least one intersection between a first WSP track on a first layer and a second WSP track on a second layer.

10. A non-transitory computer-readable storage medium having stored thereon instructions that when executed by a machine result in the following operations:

receiving, using a processor, an electronic design library including a plurality of design rules;

generating a routing graph, based upon, at least in part, the plurality of design rules, wherein the routing graph is a virtual representation of all of the available routing space for all routing layers associated with an electronic design, wherein the routing graph is based upon, at least in part, one or more width spacing pattern ("WSP") tracks for each routing layer, wherein a WSP track specifies a minimum spacing between one or more tracks in the electronic design or a minimum width of any shape associated with a given track; and dynamically updating the routing graph at a graphical user interface, based upon, at least in part, a creation of a routing segment or a via at the graphical user interface.

11. The non-transitory computer-readable storage medium of claim 10, wherein the routing graph includes one or more edges and one or more vertices.

12. The non-transitory computer-readable storage medium of claim 10, further comprising:
identifying at least one pre-routed shape or route segment on the one or more WSP tracks.

13. The non-transitory computer-readable storage medium of claim 12, further comprising:
generating a spacing influence region around the at least one pre-routed shape or route segment.

14. The non-transitory computer-readable storage medium of claim 13, further comprising:
analyzing the remaining unoccupied space on the one or more WSP tracks.

15. The non-transitory computer-readable storage medium of claim 13, wherein generating a spacing influence region is based upon, at least in part, a segment service analysis.

16. The non-transitory computer-readable storage medium of claim 13, wherein generating a spacing influence region is based upon, at least in part, a via service analysis.

17. The non-transitory computer-readable storage medium of claim 16, wherein the via service provides a router with an optimal via to satisfy a design rule check analysis.

18. The non-transitory computer-readable storage medium of claim 10, further comprising:
identifying at least one intersection between a first WSP track on a first layer and a second WSP track on a second layer.

* * * * *